(12) United States Patent
De Moor et al.

(10) Patent No.: US 6,707,121 B2
(45) Date of Patent: Mar. 16, 2004

(54) MICRO ELECTRO MECHANICAL SYSTEMS AND DEVICES

(75) Inventors: Piet De Moor, Linden (BE); Chris Van Hoof, Leuven (BE)

(73) Assignee: Interuniversitair Microelektronica Centrum (IMEC VZW), Leuven (BE)

(*) Notice: Subject to any disclaimer, the term of this patent is extended or adjusted under 35 U.S.C. 154(b) by 0 days.

(21) Appl. No.: 09/816,611

(22) Filed: Mar. 23, 2001

(65) Prior Publication Data

US 2002/0009821 A1 Jan. 24, 2002

Related U.S. Application Data

(63) Continuation-in-part of application No. 09/702,501, filed on Oct. 31, 2000, now Pat. No. 6,274,462, which is a continuation of application No. 09/049,797, filed on Mar. 27, 1998, now Pat. No. 6,194,722.
(60) Provisional application No. 60/171,976, filed on Dec. 22, 1999.

(30) Foreign Application Priority Data

Mar. 28, 1997 (EP) .............................. 97870044
Mar. 24, 2000 (EP) .......................... 002011083

(51) Int. Cl.⁷ ............................................. H01L 29/84
(52) U.S. Cl. ...................................... 257/420; 257/415
(58) Field of Search ................................ 257/415, 419, 257/420, 466

(56) References Cited

U.S. PATENT DOCUMENTS

| | | | | | |
|---|---|---|---|---|---|
| 4,021,766 A | * | 5/1977 | Aine | ........................... | 257/415 |
| 5,310,449 A | * | 5/1994 | Henderson | ................... | 438/382 |
| 5,912,499 A | * | 6/1999 | Diem et al. | .................. | 257/415 |
| 5,949,119 A | * | 9/1999 | Vilain | ......................... | 257/417 |
| 6,355,578 B1 | * | 3/2002 | Okumura | ..................... | 257/254 |

OTHER PUBLICATIONS

J. Brugger et al., "Silicon micro/nanomechanical Device Fabrication Based on Focused Ion Beam Etching Surface Modification and KOH Etching," in Microelectronic engineering 35 (1997) p. 401–404.

Muller et al., "Mechanical Performance of an Integrated Microgimbal/Microactuator for Disk Drives," Proc. Of the Transducers '99 Conference, Jun. 1999, Sendai, Japan, p. 1002–1005 (1999).

* cited by examiner

Primary Examiner—Allan R. Wilson
(74) Attorney, Agent, or Firm—McDonnell Boehnen Hulbert & Berghoff

(57) ABSTRACT

Structures and methods are disclosed to produce mechanical strength in Micro Electro Mechanical Systems by increasing the moment of inertia of some of the composing elements. In one aspect, a thermal sensor with improved mechanical strength, thermal insulation and time constant is achieved. Moreover, the current method and apparatus is advantageous in terms of process time and process cost, particularly in the area of lithographic patterning.

23 Claims, 22 Drawing Sheets

MICRO ELECTRO MECHANICAL SYSTEMS AND DEVICES

REFERENCE TO RELATED APPLICATIONS

The current patent application is a continuation-in-part of U.S. patent application Ser. No. 09/702,501 filed Oct. 31, 2000, entitled "Method Of Fabrication Of An Infrared Radiation Detector And Infrared Detector Device," now U.S. Pat. No. 6,274,462, which is a continuation of U.S. patent application Ser. No. 09/049,797 filed Mar. 27, 1998 now U.S. Pat. No. 6,194,722. This application further claims priority benefits to European Patent Application Number EP 97870044.1 filed on Mar. 28, 1997 and to European Patent Application Number EP 002011083.3 filed on Mar. 24, 2000. This application claims priority benefits to U.S. Provisional Application Ser. No. 60/171,976 filed on Dec. 22, 1999. This application incorporates by reference U.S. Pat. No. 6,194,722 in its entirety. This application further incorporates by reference European Patent Application Number EP 97870044.1 filed on Mar. 28, 1997 and European Patent Application Number EP 002011083.3 filed on Mar. 24, 2000 in their entirety. This application further incorporates by reference U.S. Provisional Patent Application Ser. No. 60/171,976 filed on Dec. 22, 1999 in its entirety.

FIELD OF INVENTION

The present invention is related to methods and structures for improving mechanical strength in Micro Electro Mechanical Systems (MEMS). These methods and structures are used to produce MEMS devices with improved mechanical characteristics.

BACKGROUND OF THE INVENTION

Micro Electro Mechanical Systems (MEMS), also known as Microsystems or Micro Machined Systems, use the process technology as developed in semiconductor processing to obtain devices with the desired mechanical properties. In MEMS technology, these mechanical devices on microscale are embedded in micro-electronic circuitry. MEMS devices serve as an intermediate between the non-electrical and the electrical world or as transducers between physical quantities (e.g., transforming radiation or pressure into current). Contrary to semiconductor devices, mechanical properties such as weight, vibration, etc. are crucial for MEMS devices. The characteristics of Micro Electro Mechanical Systems (MEMS), e.g. accelerometers, thermal sensors, membrane-devices etc., are thus determined by both their transducing and mechanical properties. The strong interaction between the transducing and mechanical properties of these systems often imposes restrictions on meeting simultaneously both types of specifications.

Examples of Micro Electro Mechanical Systems devices are thermal sensors. Thermal sensors measure a temperature rise resulting from the deposition of an amount of energy within a thermally insulated piece of material, this insulated piece being the sensing element. The energy can result from a variety of interactions between the environment and the sensing element, e.g. X-ray or infrared flux absorption, reacting molecules. A "Method of fabrication of an infrared radiation detector and more particularly an infrared sensitive bolometer" is disclosed in U.S. Pat. No. 6,194,722 and is entitled "Method Of Fabrication Of An Infrared Radiation Detector And Infrared Detector Device." U.S. Pat. No. 6,194,722 is hereby incorporated by reference in its entirety.

Thermal analysis shows that the change in temperature is proportional to the thermal insulation of the device layer, the energy deposited in this layer being in general a given quantity. The better the thermal insulation of the sensing element, the more sensitive the device becomes. The energy, deposited in the sensing element, will not or to a less degree, leak away to the environment thanks to the better insulation. A larger change in temperature is thus obtained for a given amount of incident energy. Maximum thermal insulation can be obtained by suspending the sensing element on thin narrow and long beams of a thermally insulating material, so that the sensing layer is only connected to the rest of the device by these suspending beams. Between the sensing element and underlying layer there is a gap providing better thermal insulation of the sensing element.

The very last process step, being the removal of the sacrificial layer between the sensing element and the underlying substrate thereby creating the aforementioned gap, is critical and difficult. This removal is generally done by a wet etch. Due to a general problem in surface micromachining, called sticking, the removal of such a sacrificial layer causes a lot of yield loss. During the wet etch of the sacrificial layer, the surface tension of droplets under the sensing element pulls this sensing element towards the substrate. Once the sensing element reaches the substrate, strong bonding forces between this sensing element and the substrate along with the mechanical weakness of the supporting beams prevent the sensing element from returning to its original position. Once the sensing element touches the substrate, the device has a large thermal conductance to the substrate and is useless as a bolometer. Making the supporting beams thinner will improve the thermal insulation of the sensing element but turns out to make the problem of sticking more severe, resulting in yield loss during processing and packaging of such devices.

In "Mechanical performance of an integrated microgimbal/microactuator for disk drives," Proc. of the Transducers '99 Conference, June 1999, Sendai, Japan, p. 1002–1005 (1999) by L. Muller, J. M. Noworolsky, R. T. Howe and A. P. Pisano, a specific structure is presented to improve the mechanical strength of parts of an assembled device, i.e., a device for reading data stored in a disk drive. However, this structure is obtained at the expense of additional, time consuming, process steps. These process steps cannot be done in the course of producing the gimbal, but require separate processing, followed by assembly. The proposed process uses thick layers having large dimensions up to 75 micrometer in this so-called high-aspect-ratio fabrication technology. Only the torsional stiffness of the supporting bars is improved, no other mechanical or physical characteristics of the device are involved by the processing of the microgimbal.

The article "Silicon micro/nanomechanical device fabrication based on focused ion beam etching surface modification and KOH etching," in Microelectronic engineering 35 (1997) p 401–404, by J. Brugger et al. discloses the improvement of the mechanical stability of freestanding nanomechanical elements by increasing the moment of inertia of the supporing elements. The technique disclosed is very complex and time consuming and does not allow waferscale processing.

SUMMARY OF THE INVENTION

One aspect the present invention aims to improve the mechanical stability of the MEMS devices. The improved mechanical strength can lead to higher production and packaging yield. It can also improve the operation of MEMS devices that have moving elements. By introducing this method, the thickness of layers can be adapted to meet other technological specifications and still have sufficient mechanical strength. The improved mechanical strength can lead to higher production and packaging yield. The improvement in mechanical strength with respect to the device properties can be expressed in terms of a figure of merit M. In the finished MEMS device, layers may indeed not be fully supported by an underlying layer and hence lack mechanical strength.

Another aim of the present invention is to provide a device for sensing electromagnetic radiation with improved mechanical characteristics and device performance.

Another aim of the present invention is to obtain an infrared sensor with improved mechanical characteristics and device performance. An advantage of this device is that the thickness of the layer, e.g. the sensing layer, can be adapted to have the maximum temperature sensitivity thanks to a minimal thermal conductance possible for a given layout or material choice. Another advantage of such a device is that the time constant of this thermal sensor is minimized to such a level that the device can be applied in fast thermal sensor camera applications. The improved mechanical strength allows using a minimal layout of the devices so the thermal sensor can be used in an array-type of circuitry. The improvement in mechanical strength with respect to the device properties can be expressed in terms of a figure of merit M. In the present application, the term "layer" should be understood as a stack of at least one layer. U- or I-shaped layer means that a part of the cross section of this layer has a U- or I-shaped profile. Generally, a structure in a MEMS device which provides a three-dimensional shape to a part of a MEMS device will be called a "microstructure" and insofar as it improves the mechanical properties of the device, e.g. its rigidity, it will be called a "rigidizing microstructure." In one aspect of the invention, MEMS devices with improved mechanical characteristics are provided.

The aims of the invention are solved by devices and methods defined in the attached claims.

In one embodiment of the invention, the resistance of layers in MEMS devices to bending, lateral or torsion forces, having a static or dynamic nature, is increased by providing these layers with one or more rigidizing microstructures. The term "rigidized" is well known in the mechanical arts and refers to providing structures such as corrugations to improve the mechanical properties of a sheet material, especially improving the resistance to bending and/or deformation. "Internally rigidized" refers to a form of rigidizing in which the reinforcing structures are contained within the confines of a layer, i.e., it does not involve the application of external rigidizing elements which extend beyond the edges of the layer concerned. Preferred microstructures are those similar to an I- or U-profile or a combination of such profiles in a two-dimensional array instead of using the conventional rectangular profiles. In the finished MEMS device, layers may indeed not be fully supported by an underlying layer and hence lack mechanical strength. At least a part of non-fully supported layer is a membrane, that is a thin layer of such an extent that it has a recognizable and useful area. Such a membrane may be come in a variety of shapes including circular, elliptical, oval, quadratic, a parallelepiped or a similar 2-D shape overall. The membrane is attached to a substrate by a support system.

The present invention provides a device comprising a membrane element supported by a supporting structure attached to a substrate and usually to one or more points are areas on one or more edges of the membrane element. The supporting structure may be beams, anchor points or areas, or similar structures. The connection point of a beam to the membrane or the anchor portions of the membrane may be substantially at the perimeter of the membrane, but the present invention is not limited thereto.

The support system such as a beam may have a layer which is common with the membrane element. This common layer may be deposited and processed at the same time. This allows processes for rigidizing the membrane element and the support structure to be carried out at the same time involving introduction of reinforcing microstructures into these elements, or alternatively only into the support structure or only into the membrane element to be rigidized.

In another embodiment of the invention a method is presented to obtain 3-D microstructures such as I- or U-shaped profiled layers by applying a sequence comprising processing steps, such as depositing and patterning of layers, steps known themselves as a common practice specifically in MEMS process technology and more generally in semiconductor process technology but without the novel features of the present invention.

In another embodiment of the invention a MEMS device is disclosed comprising a planar element or membrane, having an improved mechanical strength.

In another aspect of the invention a device is presented containing at least one membrane with a rigidizing microstructure, for example, an I or U-shaped profiled layer.

For example, in another embodiment of the invention these microstructures, e.g. I- and U-profiles, can be repeated along and/or across the layer. The profiles may be combined within the layer, especially to provide a rigidizing grid of elongated microstructure elements extending in two dimensions.

In another aspect of the invention, a thermal sensor, e.g. infra-red sensor, having a membrane, especially a membrane which supports or is integral with a sensing element of the sensor, is provided having improved mechanical strength to bending or lateral forces, by applying a microstructure in the membrane e.g. an I or U-shaped layer or a combination thereof. whereby The improved mechanical strength of the planar element allows the use of thinner layers and results in a faster read-out of the sensor.

DESCRIPTION OF THE DRAWINGS

FIGS. 1a–b show typical layout and dimensions of an uncooled bolometer with rectangular supporting beams wherein FIG. 1a shows the top view and FIG. 1b shows the cross-sectional view, with element 11 being the sensing element or pixel, and element 12 being supporting beam.

FIGS. 7a–f show the processing of an infrared sensor, according to one embodiment of U.S. Pat. No. 6,194,722.

DETAILED DESCRIPTION

For the purpose of teaching of the invention, preferred embodiments of the method are described in the sequel. The present invention will be described with respect to certain embodiments and drawings. It will however be apparent to the person skilled in the art that other alternatives and equivalents or embodiments of the invention or combinations thereof can be conceived and reduced to practice without departing from the true spirit of the invention as defined in the attached claims. Dimensions are given in micrometers, using the symbols micron or μm, or in square micrometer, using the symbol $\mu m^2$.

The mechanical stability of the MEMS devices needs to be improved because this improvement can result in larger production and packaging yield, as the device can withstand mechanical shocks and loads better, for example during handling. Mechanical stability can also lead to a better operation of the device, as the device has a higher resistance to external mechanical or chemical forces, which can be present during fabrication or operating of the device. One approach might be to attempt to improve the mechanical stability of the MEMS devices only by increasing the dimensions of the layers, e.g. by using thicker layers. Thicker layers can however decrease the sensitivity and efficiency of the MEMS-devices. Thicker layers can also lead to increased process cost and process time. Methods and structures need to be developed to improve the mechanical stability of the devices without having to increase the dimensions of the processed layers. Moreover, the dimensions of the processed layers should ideally be decreased.

Figure 3:
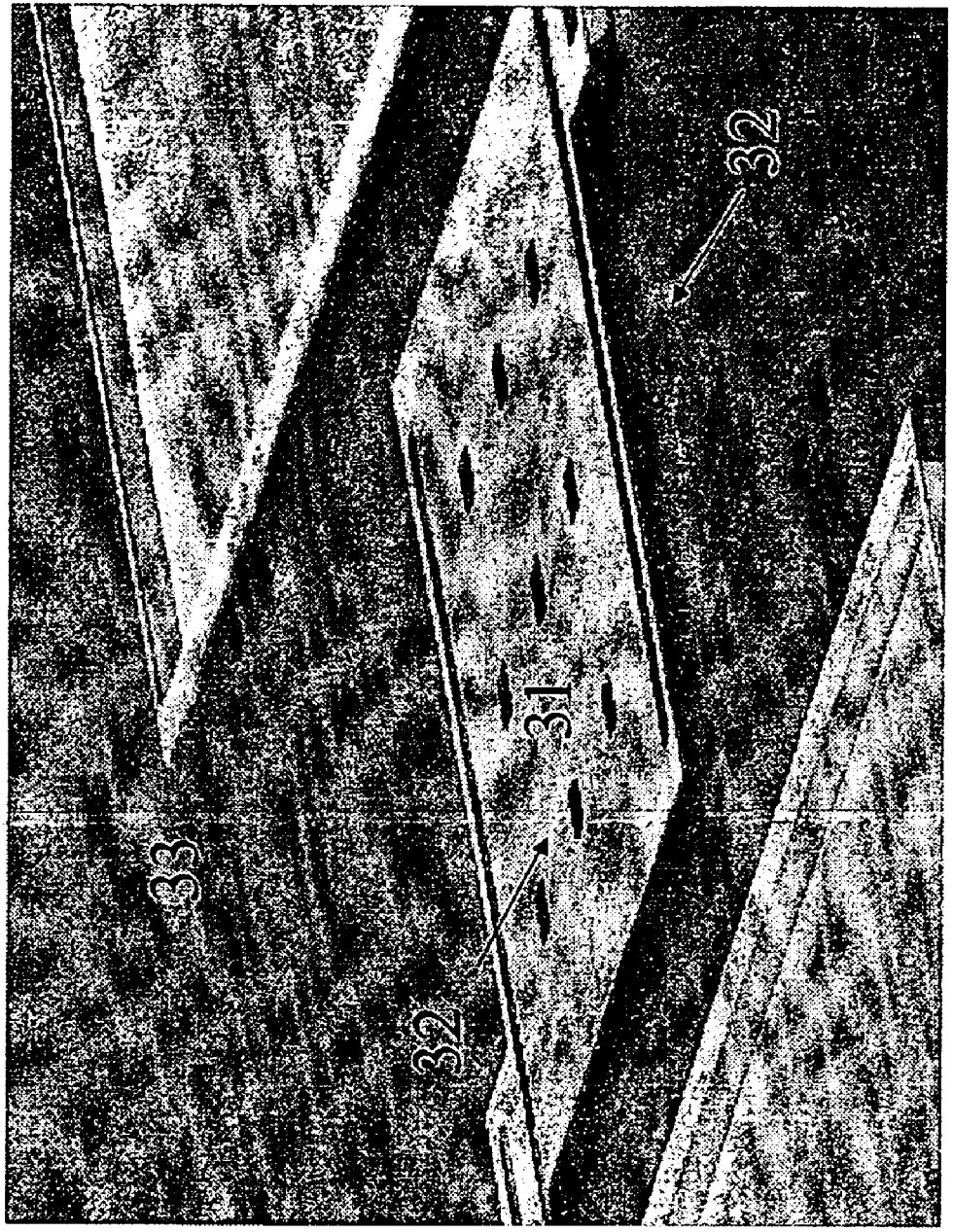
FIG. 3 is an example of a micrograph of an infrared bolometer where the sensing element 31, in the middle of the picture, is suspended by two narrows beams with rectangular cross section 32. There is a gap between the sensing element 31 and the substrate 33.

For the purpose of this invention, the mechanical properties of Micro Electro Mechanical Systems (MEMS), more specific bolometers or infrared sensors, are described using the mechanical bending behavior of cantilevers and planar membranes. A bolometer is a device to transform radiation into electric parameter. A cantilever is an elongated beam only supported at one of its four sides, that is at one of its ends. Such a cantilever, as shown in FIGS. 5a–b, is a rather good model for the mechanical behavior of the bolometer beams, supporting the sensing element, as well as the sensing element itself as shown in FIG. 3. The beams are the most fragile part of the bolometer. The membrane carrying the sensing element or having the sensing element integral therewith is sensitive to all forms of mechanical distortion, especially distortion caused by its own weight, by internal stresses and by attraction to other objects such as to the substrate. Finite element simulations allow study of complex systems such as a complete bolometer. Only qualitative results can be obtained from the cantilever analysis however.

Figure 1:
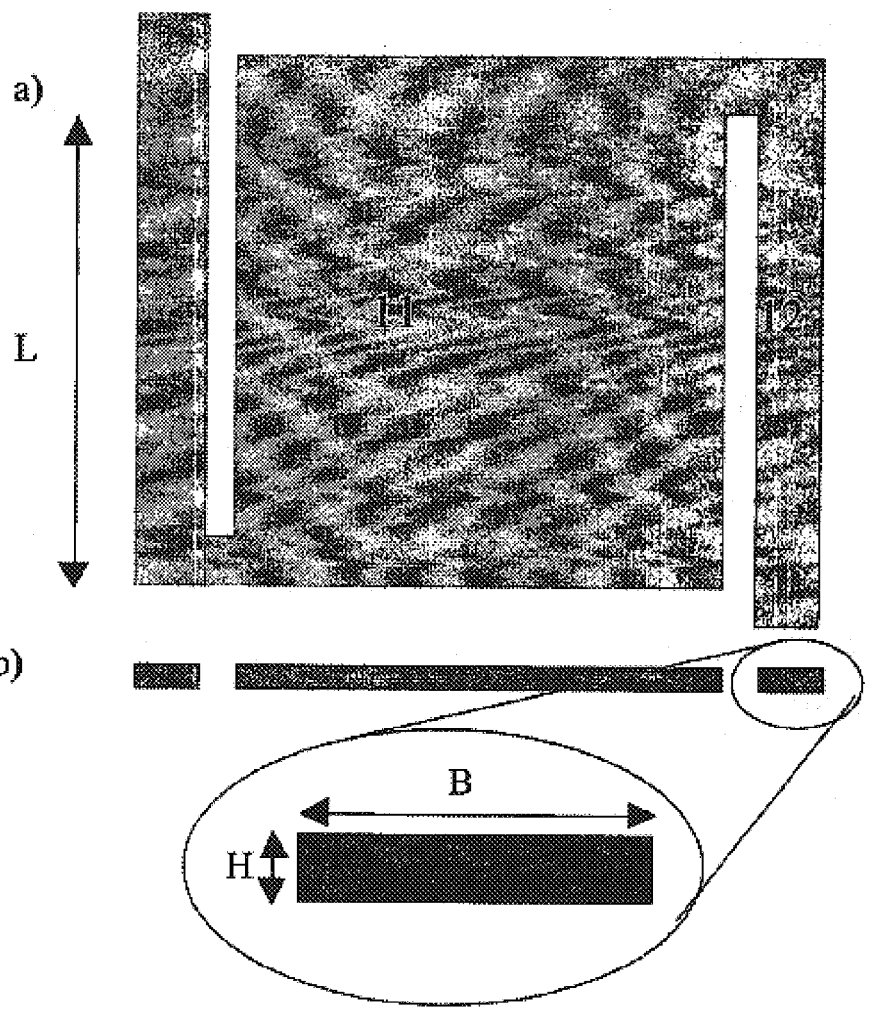
Figure 2:
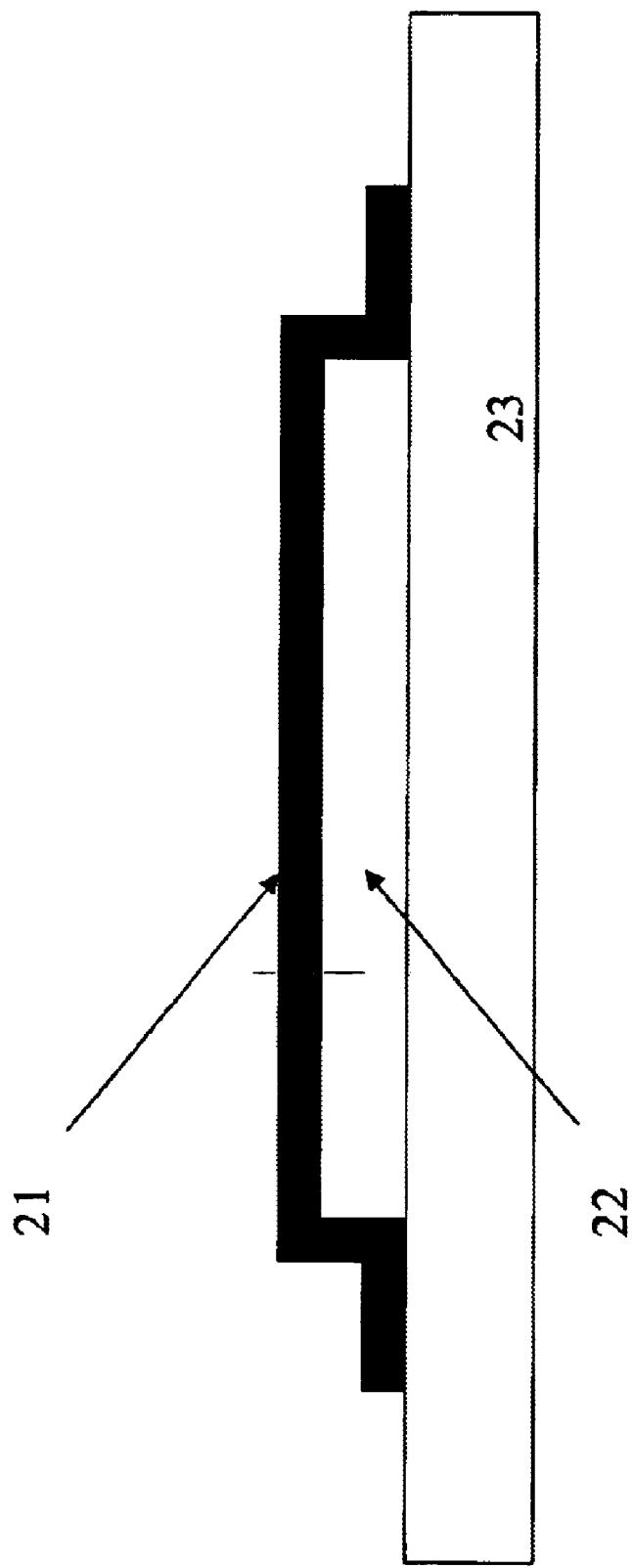
FIG. 2 is one example of the side view of a bolometer, a device to transform radiation into electric parameters, with element 21 being a sensing element, element 22 being a sacrificial layer, and element 23 being a substrate.

The presently preferred embodiments of the invention will now be described by reference to the accompanying figures, wherein like elements are referred to by like numerals. A schematic representation of such a bolometer is given in FIGS. 1a–b, showing the sensing element 11 in the form of a planar membrane suspended by 2 rectangular beams 12 having dimensions length L, width B and height H. A schematic side view of the sensing element 21, still supported by a sacrificial layer 22, on top of substrate 23 is shown in FIG. 2. In a preferred embodiment, the substrate 23 may be composed of a semiconductor substrate. In alternate embodiment, the substrate 23 may be composed of other substrates.

The thermal conductance G of an elongated element such as a supporting beam is proportional to the thermal conductivity g of the beam material, e.g. polycrystalline SiGe, and to a geometrical factor being the ratio of the cross-sectional area A in the direction of thermal transfer to the length L of the element in the same direction:

$$G=gA/L \quad (1)$$

where the beam is rectangular in cross-section with a width B and a thickness H this formula becomes:

$$G=gB\,H/L \quad (1a)$$

Generally, in the following reference will be made to structures with rectangular cross-sections but it should be understood that the invention is not limited thereto. To maximize the sensitivity of a bolometer for instance, G has to be minimized. For instance, a material with low g can be used or L can be made long or minimal dimensions of B and H can be used; however, all these dimensions have practical limits and are interrelated with each other as to the mechanical strength of the element. State of the art lithography and etching techniques can limit the width B, say to 1 micron. Typical thickness H may range from 0.1 to 10 micron, preferably 0.25 to 1 micron. For thin membranes, the practical range of "thinness" may be defined by a dimensionless constant: the ratio of the square root of the area to its thickness. With respect to the present invention, this ratio lies in the range between 10 and 10,000, preferably between 50 and 5000. A membrane typically has a ratio between a maximum and minimum lateral dimension. For example, with respect to the present invention a membrane may have a ratio of its minimum lateral dimension (e.g. for a rectangular membrane its width) to its maximum lateral dimension (e.g. for a rectangular membrane its length) of 5 to 1 or less.

When applying a force F at the end of a cantilevered beam or sheet with length L, the cantilever deflection D at the end of the cantilever is direct proportional to F, the third power of L and inversely proportional to the Young modulus of the cantilever material E, and its moment of inertia I:

$$D \approx \frac{FL^3}{IE} \quad (2)$$

For a given force F, e.g. the weight of the pixel structure, surface tension during the etching of the sacrificial layer, the deflection D can be minimized by reducing the length L, or by increasing the moment of inertia I and the Young modulus E. However, the Young modulus E is a given material property, and the variations from one material to another are generally small, as compared to the decrease in deflection obtained when changing length L or moment of inertia L.

Indeed, a reduction of the cantilever or membrane length L by a factor of 2 already results in a deflection being 8 times smaller. Since the thermal insulation of a bolometer is however proportional to the length of the beams, and the sensitivity of the sensor is proportional to the area of the sensing membrane, this is not an effective route to enhance the stiffness of these elements while maintaining good thermal properties, e.g. a high thermal insulation of the beams or a high sensitivity of the sensor. So, the most important parameter to change is the moment of inertia I, which is defined in classical mechanics as follows:

$$I = \int_S y^2 dS \quad (3)$$

S is the cross section of the cantilever or membrane. The y-axis is defined by the direction in which the force is applied, and hence the deflection. The origin of this y-axis is defined by the so-called neutral axis of the cantilever or membrane, which is in fact the center of mass defined by:

$$\int_S y\,dS = 0 \quad (4)$$

Qualitatively, these formulas express that the stiffness of a cantilever or a membrane, as given by the moment of inertia, increases quadratically with the amount of material that is far away, having a large y-value, from the center of mass in the direction of the applied force. In case of the classical rectangular beam or membrane cross-section, having width B and a height H, the moment of inertia $I_r$ is:

$$I_r = \frac{BH^3}{12} \quad (5)$$

From formula (5), it is clear that a gain in thermal insulation of a beam obtained through a reduction of the beam height H being equal in this case to the layer thickness t, results in a smaller moment of inertia, and thus in a larger deflection d for a given force F. Similarly, reduction in the sensor membrane thickness reduces the weight of the membrane proportional to this reduction but also results in a lower moment of inertia to a higher power of its thickness so the overall result is a much weaker membrane.

From the above, it can be concluded that if only the dimensions of the rectangular profile are changed to increase the moment of inertia, mechanical and device specifications are in conflict. For example, in case of bolometers, the moment of inertia I must increase while maintaining a good thermal insulation for the supporting beams or a low weight for the sensor membrane. Not only do the dimensions have to change, but also does the cross section and the layout of the profile have to change in order to obtain a MEMS device with improved mechanical strength that can also be independent of the sensing properties of the device. However, one should keep in mind that MEMS processing is considered as a two-dimensional kind of processing. After depositing the layers, these layers are patterned but the thickness of these layers remains constant, changes due to process variations or dependencies not being taken into account. The cross section or profile of the layers is not deliberately changed. If the change of profiles of the supporting beams or other elements can be done as an integral part of the processing of the MEMS device, the steps of assembling the MEMS device and the supporting structure can be omitted, avoiding additional yield problems.

Figure 6:
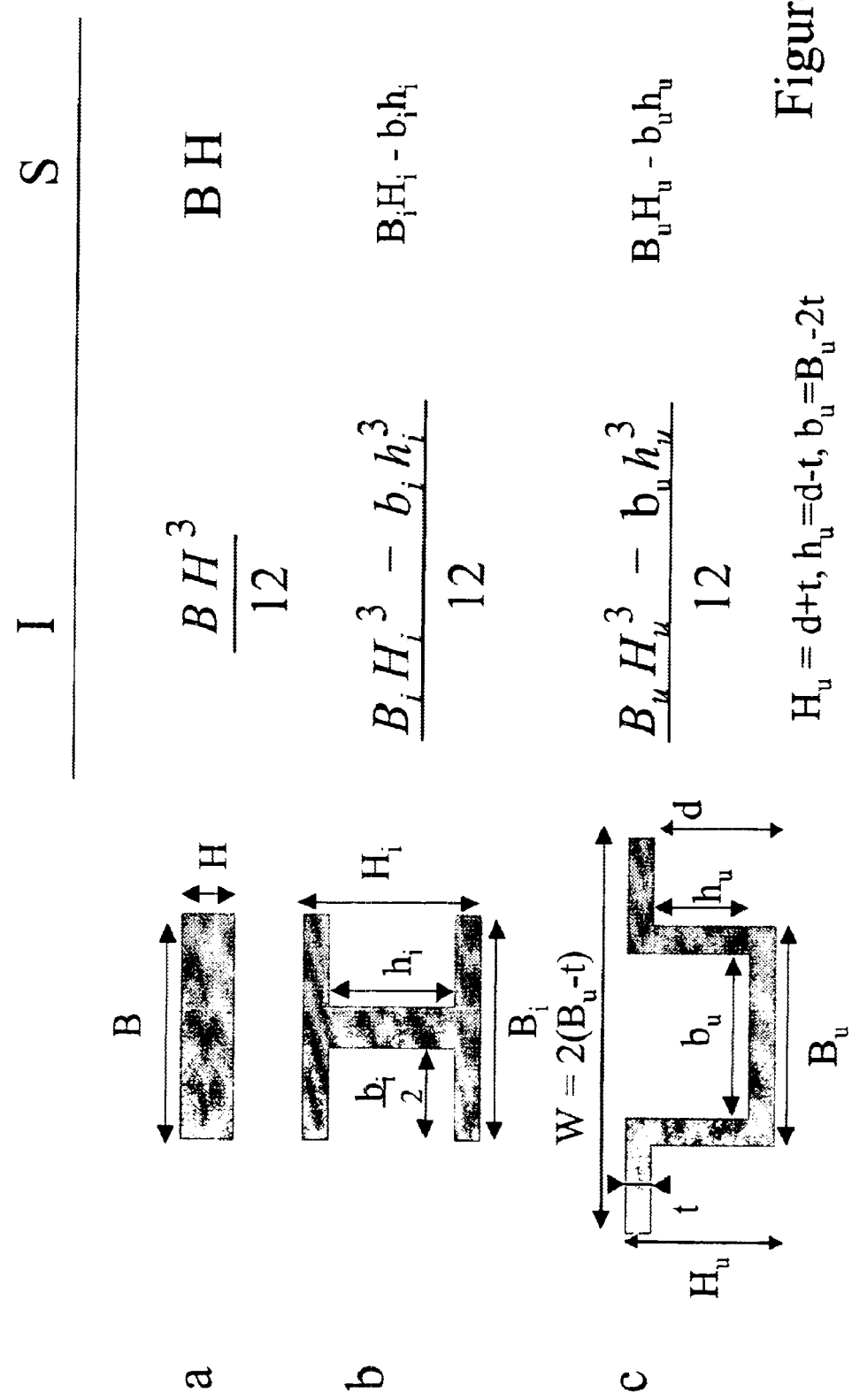
FIGS. 6a–c are cross sections of different profiles and their corresponding moment of inertia I and cross sectional area S, with FIG. 6a being a rectangular, element, FIG. 6b being an I-profile, and FIG. 6c being a U-profile.

FIGS. 6a–c list different possible cross sections of microstructures which can be introduced into the supporting beams or the sensor membrane and their corresponding moment of inertia I and cross sectional area S. Specifically, FIGS. 6a–c correspond to the following:

FIG. 6a:
  B, H: respectively width and height of the beam or membrane with rectangular cross section FIG. 6b:
- $B_i$, $H_i$: respectively outer width and outer height of the I-shaped structure in a beam or membrane
- $b_i$, $h_i$: inner dimensions of the I-shaped beam or membrane FIG. 6c:
- $B_u$, d: width and depth of the cavity, created during partial etching of the sacrificial layer
- t=thickness of the device layer
- $W=2(B_u-t)$: beam width of the U-shaped beam or membrane
- $h_u=d-t$: inner height
- $b_u=B_u-2t$: inner width
- $H_u=d+t$=outer height From FIGS. 6a–c, it can be concluded that a U-profile can offer the same maximal mechanical strength and minimum cross section as an I-profile in comparison to the rectangular profile. In general, U-profiles with different dimensions are possible; however, the U-profile given in FIG. 6 combines an optimal mechanical strength and a minimized cross section. Minimum cross section implies minimum weight and a low thermal conductivity and/or thermal capacity in case of thermally insulated MEMS devices, such as bolometers.

Figure 14:
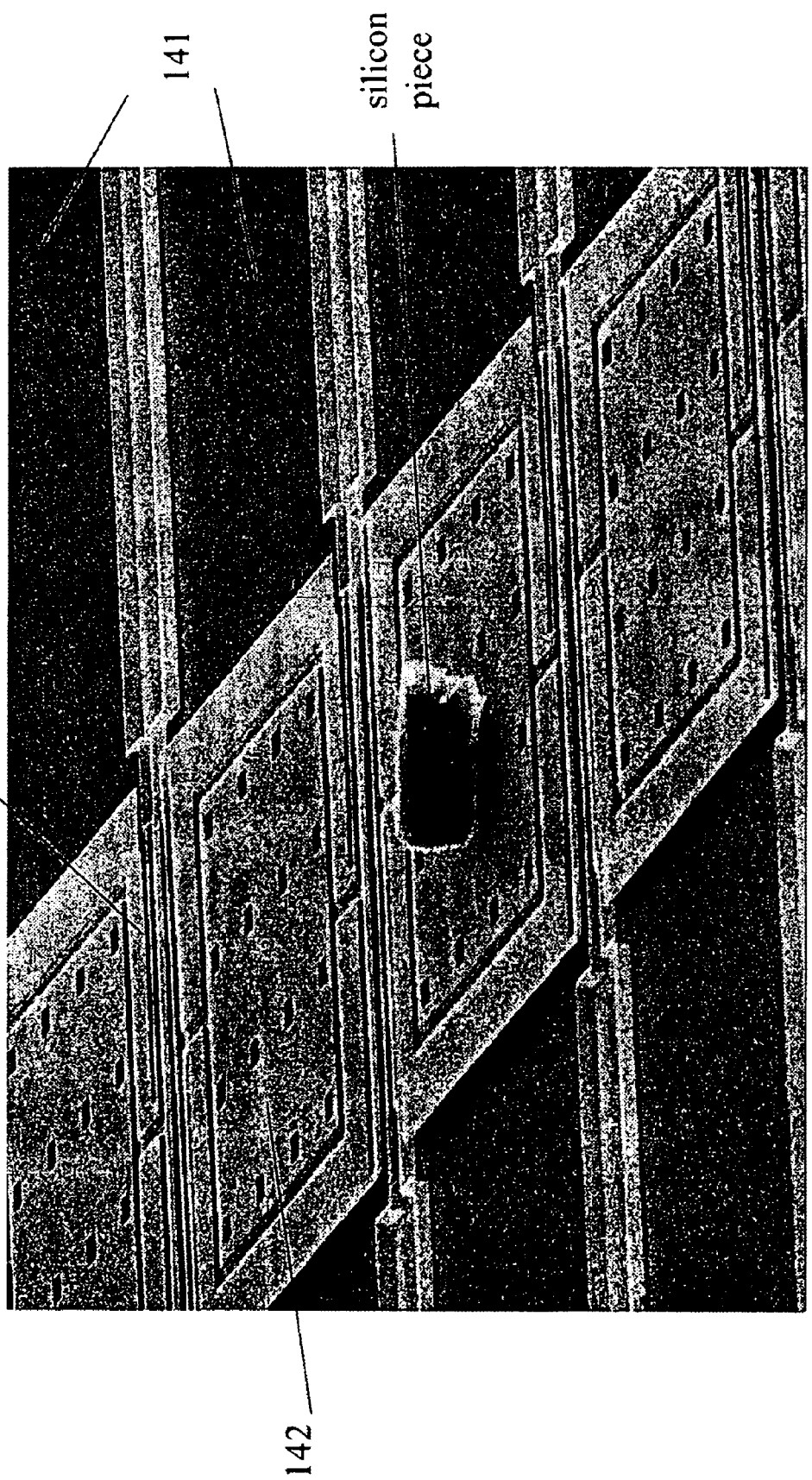
FIG. 14 illustrates the improved strength of the sensor due to the profiling of the layer: pixel 142, substrate 141, beams 143. A piece of silicon is put on top of the pixel. No deformation of the pixel or beams is noticed.

Improved mechanical strength can also allow the use of thicker device layers. For example, in X-ray bolometers a thick absorber layer needs to be used in order to capture the X-rays. With the improved mechanical strength of the supporting beams and/or sensing membrane elements using a thick absorber layer on top of the sensing membrane element is feasible. This improvement in mechanical strength is illustrated in FIG. 14.

If the sensor is to be arranged in array-type circuitry, e.g. as pixels in a camera application, minimal layout (footprint) of the sensor is important to increase the pixel density. Minimal layout can be obtained by minimal length of the supporting beams, but decreasing the length L of these beams will increase the thermal conductivity G as explained in formula 1. However, by using for example U-shaped beams, a thin beam with low thermal conductivity G (see formula 1), but high enough mechanical strength is obtained. The small cross section of the beam compensates for the small length of the beam, thereby resulting in a low enough thermal conductivity G.

Larger devices can be made because for a given layer thickness the dimensions of the sensing element can be increased as the mechanical strength of the supporting elements and/or of the sensing membrane element is increased. For example, in a bolometer, the pixel can be extended till above the reading circuitry, thereby improving the fill factor of the sensor. Functionality of the devices can increase, as for example multiple layers can be stacked on top of each other.

For the purpose of understanding the present invention, a bolometer using beams and/or membrane with rigidizing microstructures such as U-shaped supporting beams will be described in more detail. Having the same excellent stiffness and minimum cross section of an I-profile, the U-profile is easier to manufacture. The "Method Of Fabrication Of An Infrared Radiation Detector And Infrared Detector Device" is the subject of a U.S. Pat. No. 6,194,722. This application is incorporated by reference in its entirety.

The processing of a bolometer according to an embodiment of this patent is illustrated in FIGS. 7a–f, comprising the following steps:

step a: forming a sacrificial layer 71 on a substrate 73, as shown in FIG. 7a.

step b: patterning of the sacrificial layer 71, as shown in FIG. 7b. The sacrificial layer remains where the sensing element and the supporting beams will be defined.

step c: deposition of semiconductor layer such as polycrystalline Silicon Germanium (SiGe) 72, on this patterned sacrificial layer, as shown in FIG. 7c.

step d: patterning of device layer 72, defining the geometrical dimensions of the sensing element 78 and of the supporting beams 75, as shown in FIG. 7d. A top view is shown in FIG. 7d and a cross-sectional X—X is shown in FIG. 7e. The sensing element is entirely located within the boundaries of the sacrificial layer, as patterned during the step b.

step e: the supporting beams 75 are partially located on this sacrificial layer 71, as one end contacts the substrate 73, as shown in FIG. 7f. The sensing element is not drawn in this figure.

step f: etching of the sacrificial layer, thereby releasing the sensing element and the supporting beams, as shown in FIG. 7f. The sensing element 72 is contacted with the supporting beams 75, the supporting beams are contacted with the substrate 73. Only the beams 75 mechanically support the sensing or planar element 72.

The processing of a bolometer having U-shaped supporting beams and/or a sensing membrane element with U-shaped rigidizing elements therein in accordance with an embodiment of the present invention comprises the following steps, as illustrated in FIGS. 8a–h:

step a: forming a sacrificial layer 81 on a substrate 83, as shown in FIG. 8a.

step b: patterning only a part of this sacrificial layer, as shown in FIG. 8b. The obtained opening, cavity or trench 86 has a width $B_u$. The sacrificial layer is locally etched till a depth d. Patterning can be done with several techniques e.g. lift-off or lithographic pattern definition, dry or wet etching and the removal of the photoresist layer. The trenches in the area which will form the sensing membrane element are preferably arranged in a pattern such as to strengthen the membrane in all directions, and at least in two dimensions, e.g. a crossed arrangement of trenches in the form of a square or grid. In one embodiment, steps a and b may be included as a single or a series of steps whereby a sacrificial layer is formed on a semiconductor substrate, the step of forming creating at least one cavity in said sacrificial layer.

step c: patterning of the sacrificial layer, thereby protecting by means of a protective layer 87, e.g. by means of a photoresist layer, the opening(s) etched in step b, as shown in FIG. 8c.

step d: depositing a semiconducting layer, e.g. polycrystalline Silicon Germanium (SiGe) 82, on this patterned sacrificial layer, thereby defining the profile and cross section of the supporting beams and/or sensing membrane element, as shown in FIG. 8d.

step e: patterning of a device layer 82, defining the geometrical dimensions of the sensing element 88 and of the supporting beams 85, as shown in FIG. 8e. A top view is shown in FIG. 8e and a cross section X—X is shown in FIG. 8f. The sensing element is entirely located within the boundaries of the sacrificial layer, as patterned during step b. The supporting beams are partially located on this sacrificial layer, as one end contacts the substrate step f: depositing and patterning of an infrared absorber layer 84 on the polycrystalline SiGe layer, as shown in FIG. 8g. A top view is shown in FIG. 8g and a cross section X—X is shown in FIG. 8h.

step g: removing the sacrificial layer 81. This step is also called the release of the bolometer. The sensing element is now only connected to the surrounding circuitry through its supporting beams, as illustrated in FIG. 3 for the case of rectangular beams. The sensing membrane element 82 is patterned with elongated microstructures such as U-profiles which extend in two dimensions, e.g. form a square which provides strength to the membrane 82 without increasing its weight.

The steps of only partial patterning the sacrificial layer (step b) and then the creation of the islands of sacrificial layer (step c) can be reversed if needed. In this case, first the islands are defined and afterwards the cavities are defined.

Figure 13A:
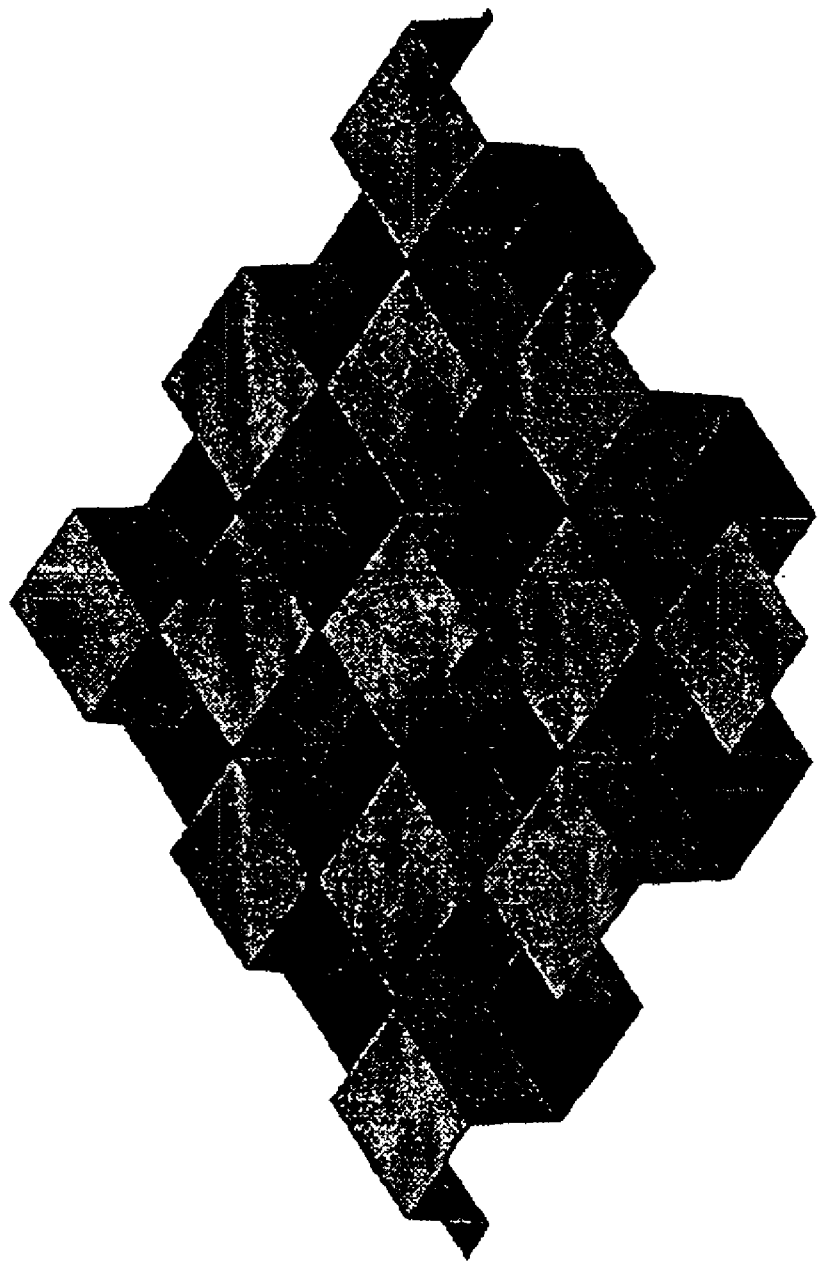
FIG. 13a is an example of a cross section of a MEMS layer having a U-profile applied in x and y-direction.
Figure 13A:
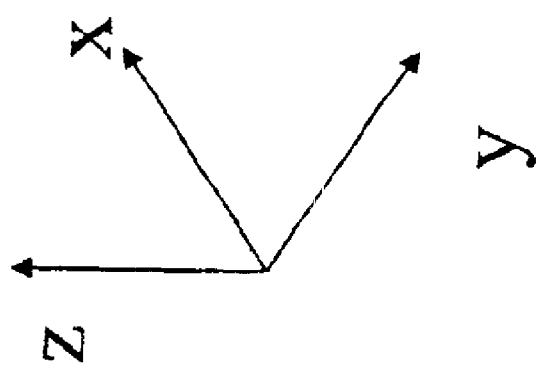
Figure 13B:
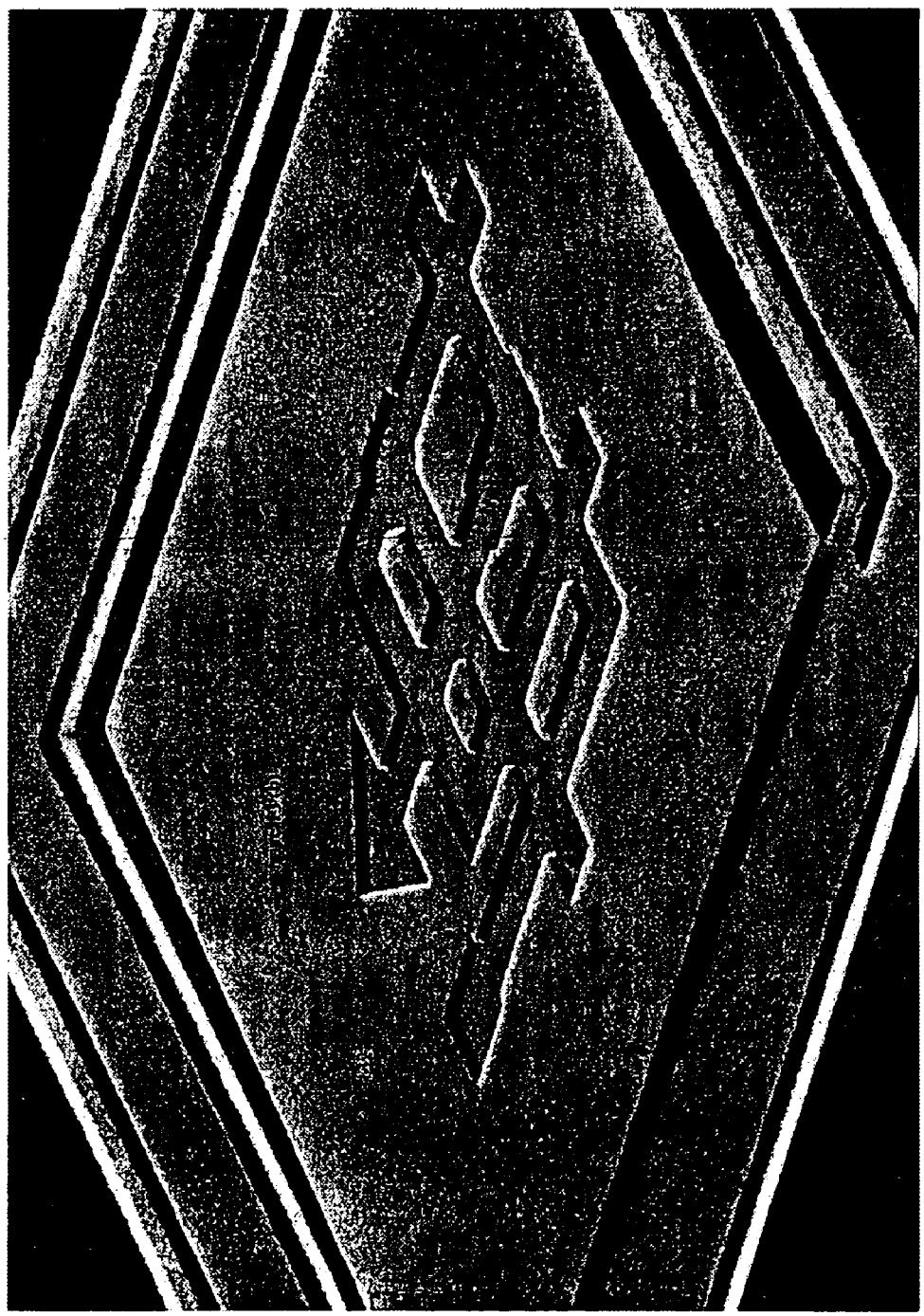
FIG. 13b is an SEM topview picture showing an example of how the integrated profiling as presented in the invention can create any desired topography in the planar membrane element 132. Here the IMEC-logo is defined. The planar element is 100 by 100 $\mu m^2$. The thickness of the layer is less then 250 μm.
Figure 15:
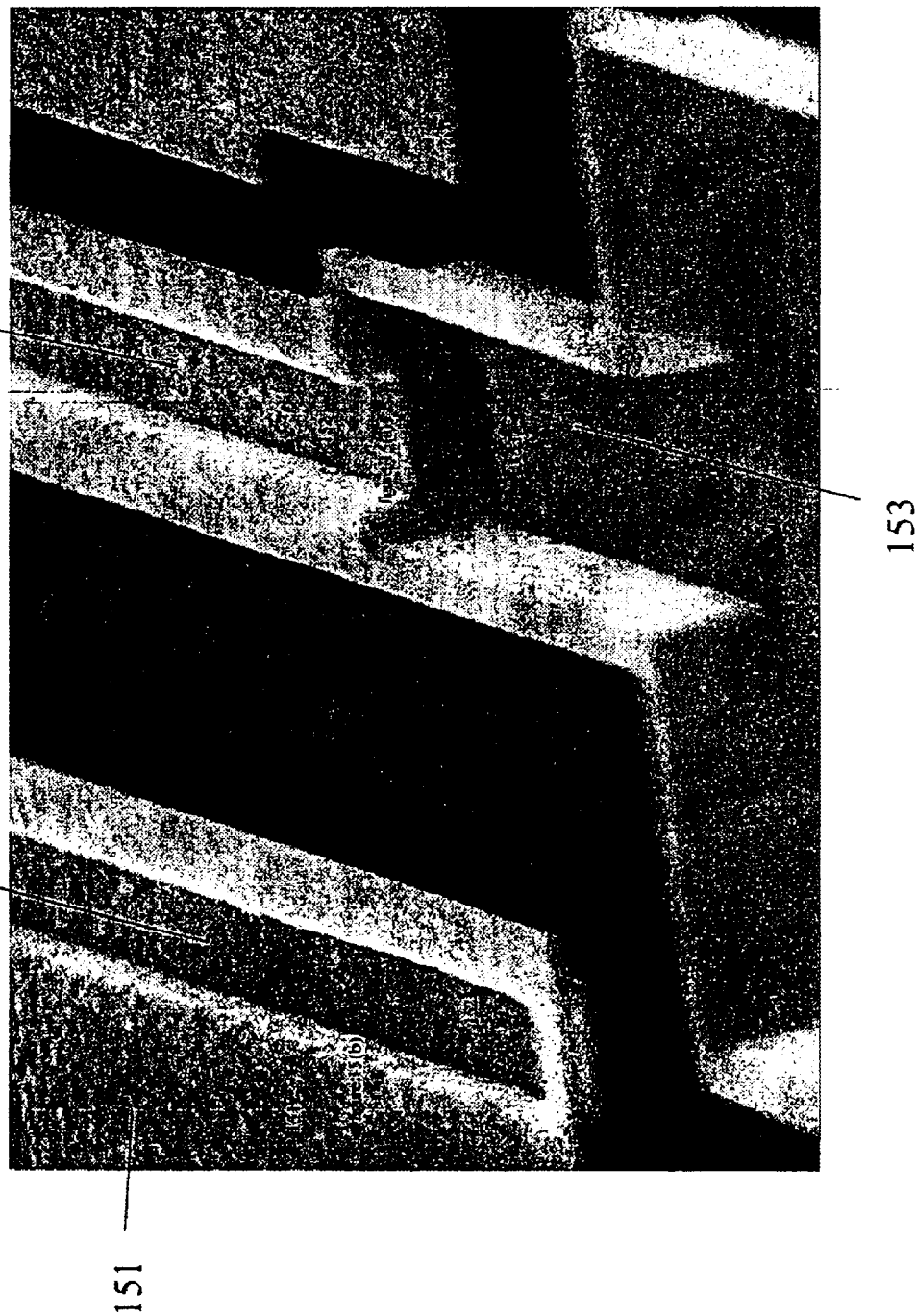
FIG. 15 shows an SEM picture, with subsection (a) showing the start of an U-shaped supporting beam 152 and its connection to the substrate 153, and subsection (b) showing the connection between the supporting beam 152 and the planar element 151.

By patterning a cavity in the sacrificial layer, the desired topography is created for the subsequent processing of the SiGe semiconductor layer. This topography results in a U-shaped cross section of the resulting supporting beam or the sensing membrane element, as the SiGe layer will follow the topography. FIGS. 13b and 14 show rigidized sensing membrane elements having internal rigidizing and FIG. 15 shows a U-shaped supporting beam according to this embodiment. FIG. 15 includes two portions: (a) the start of a U-shaped supporting beam 152 and its connection to the substrate 153; (b) the connection between the supporting beam 152 and the planar element 151.

Figure 9:
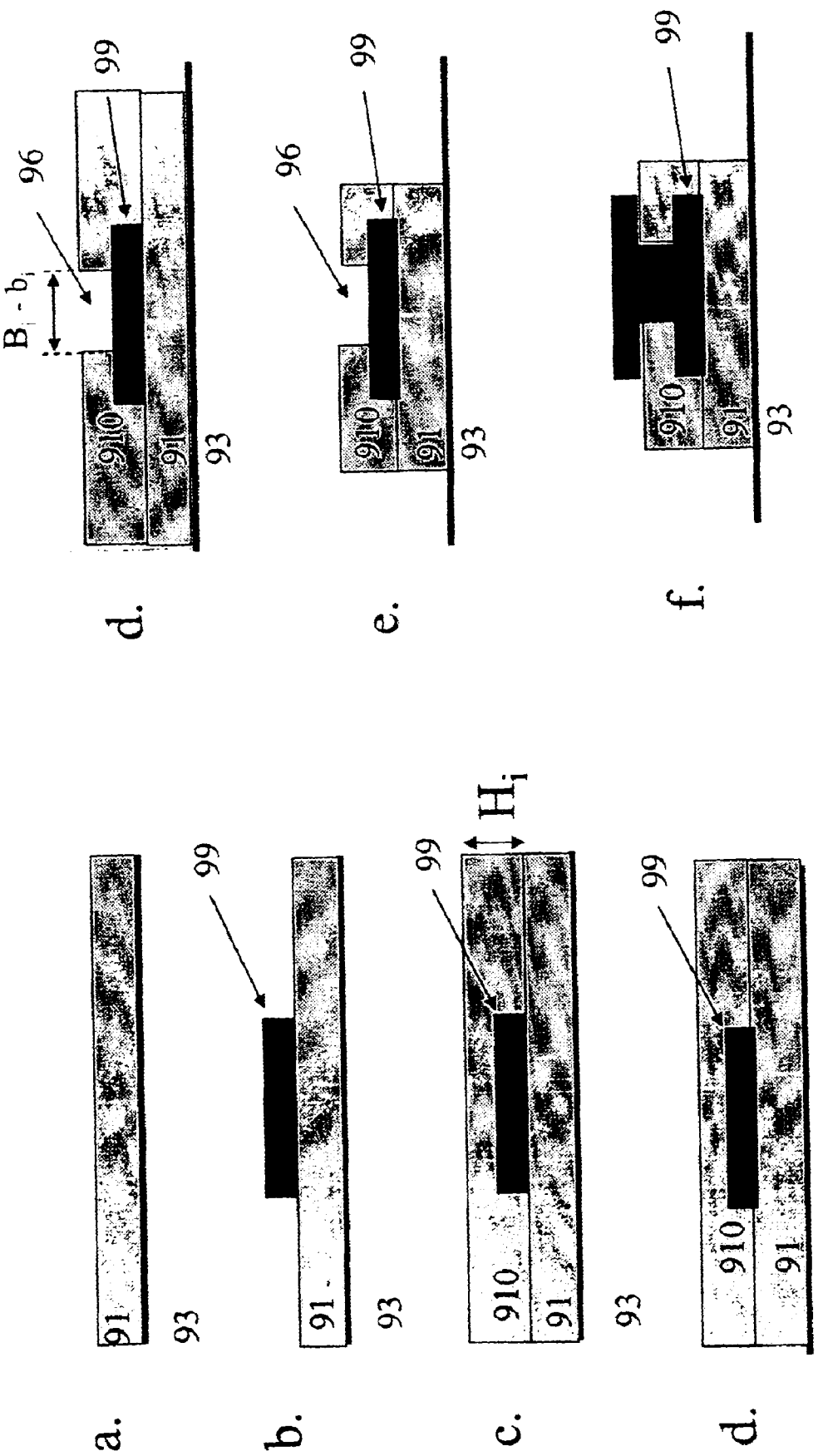
FIGS. 9a–f show an example of the processing of an infrared sensor with I-shaped supporting beams according to one embodiment of the invention.

The processing of a bolometer having I-shaped supporting beams or I-profiles in a membrane in accordance with an embodiment of the present invention may comprise the following steps, as illustrated in FIG. 9:

step a: forming the first part 91 of the sacrificial layer on a substrate 93, as shown in FIG. 9a.

step b: depositing and patterning of the bottom layer 99 of the I-profile, as shown in FIG. 9b. The bottom layer can be the same material as used for the top part of the I-profile but is not restricted to this. The top surface of the sensor membrane element may be formed by this layer of the I profile.

step c: depositing the second part 910 of the sacrificial layer having thickness $H_i$ on top of this patterned bottom layer, as shown in FIG. 9c.

step d: patterning only a part of this sacrificial layer, as shown in FIG. 9d. The obtained opening, cavity or trench 96 has a width ($B_i$–$b_i$) as defined in FIG. 6b. The sacrificial layer is locally etched until the bottom layer of the I-profiled beam is reached.

step e: patterning of the sacrificial layer thereby exposing the substrate, as shown in FIG. 9e.

Figures 1, 7:
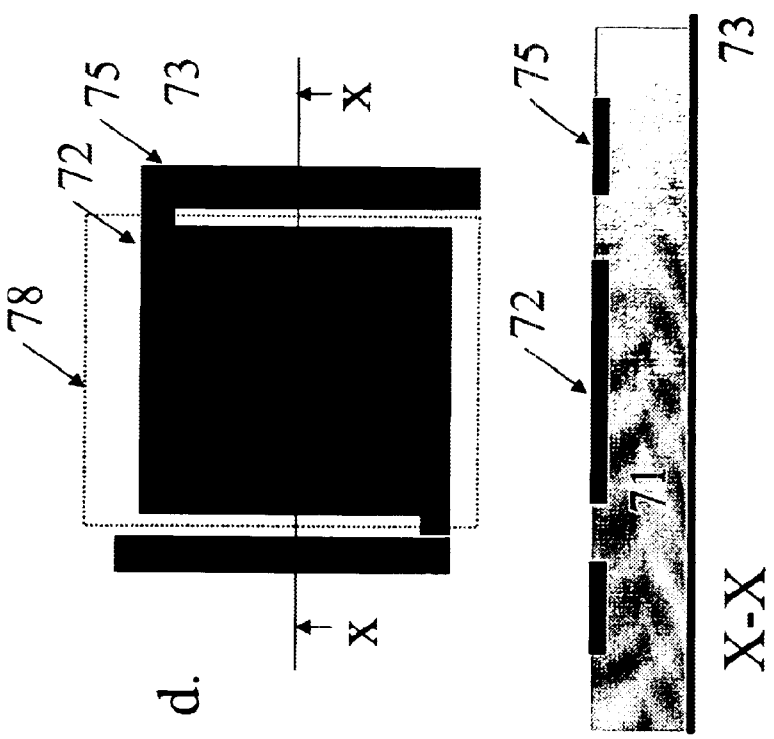
Figures 2, 7:
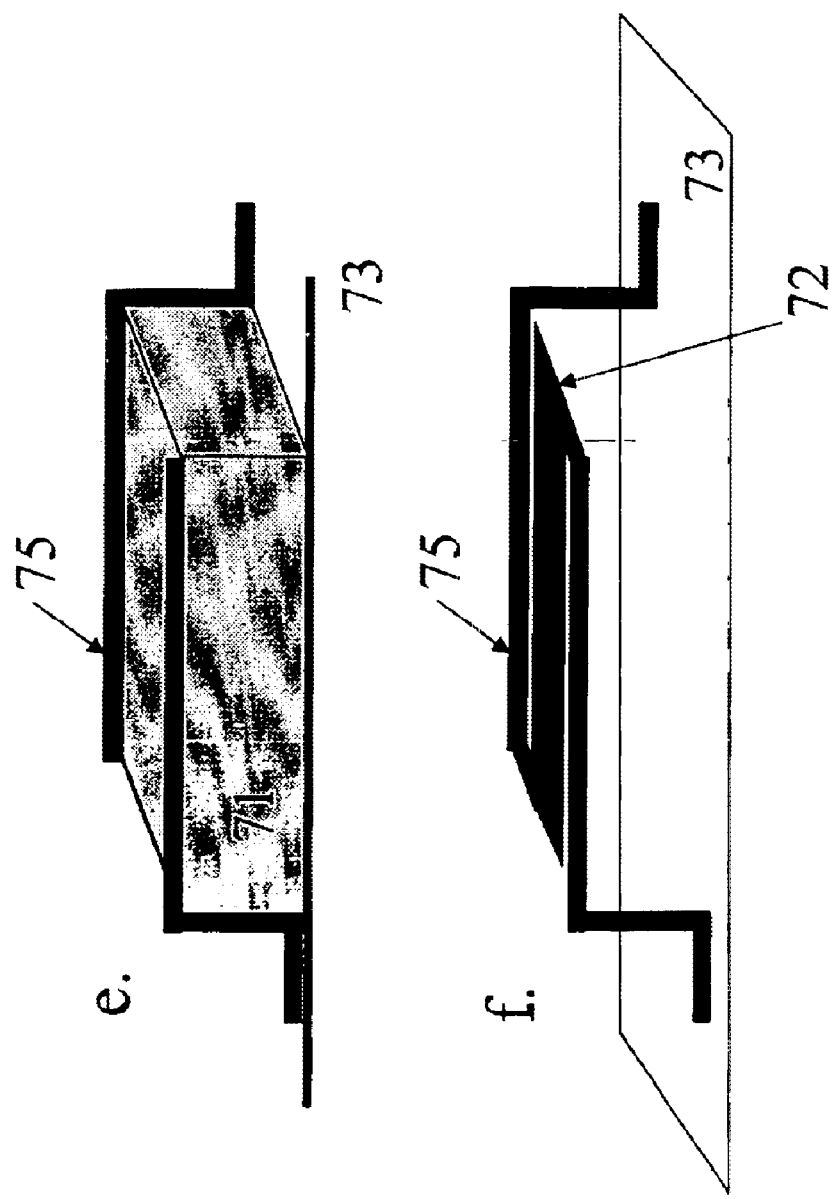
Figure 8:
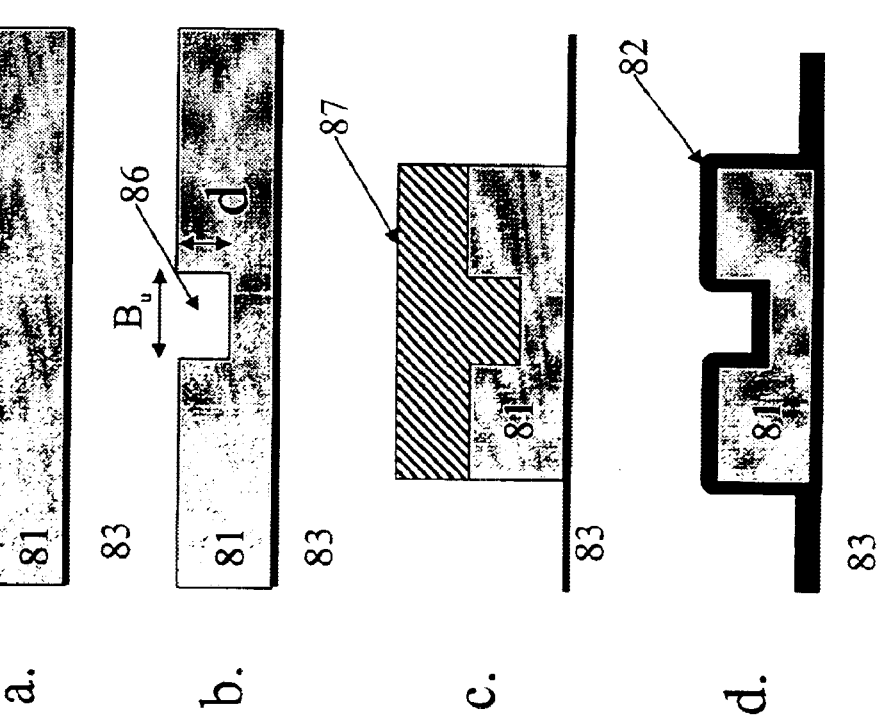
FIGS. 8a–h show an example of the processing of an infrared sensor with U-shaped supporting beams according to one embodiment of the invention.
Figure 8:
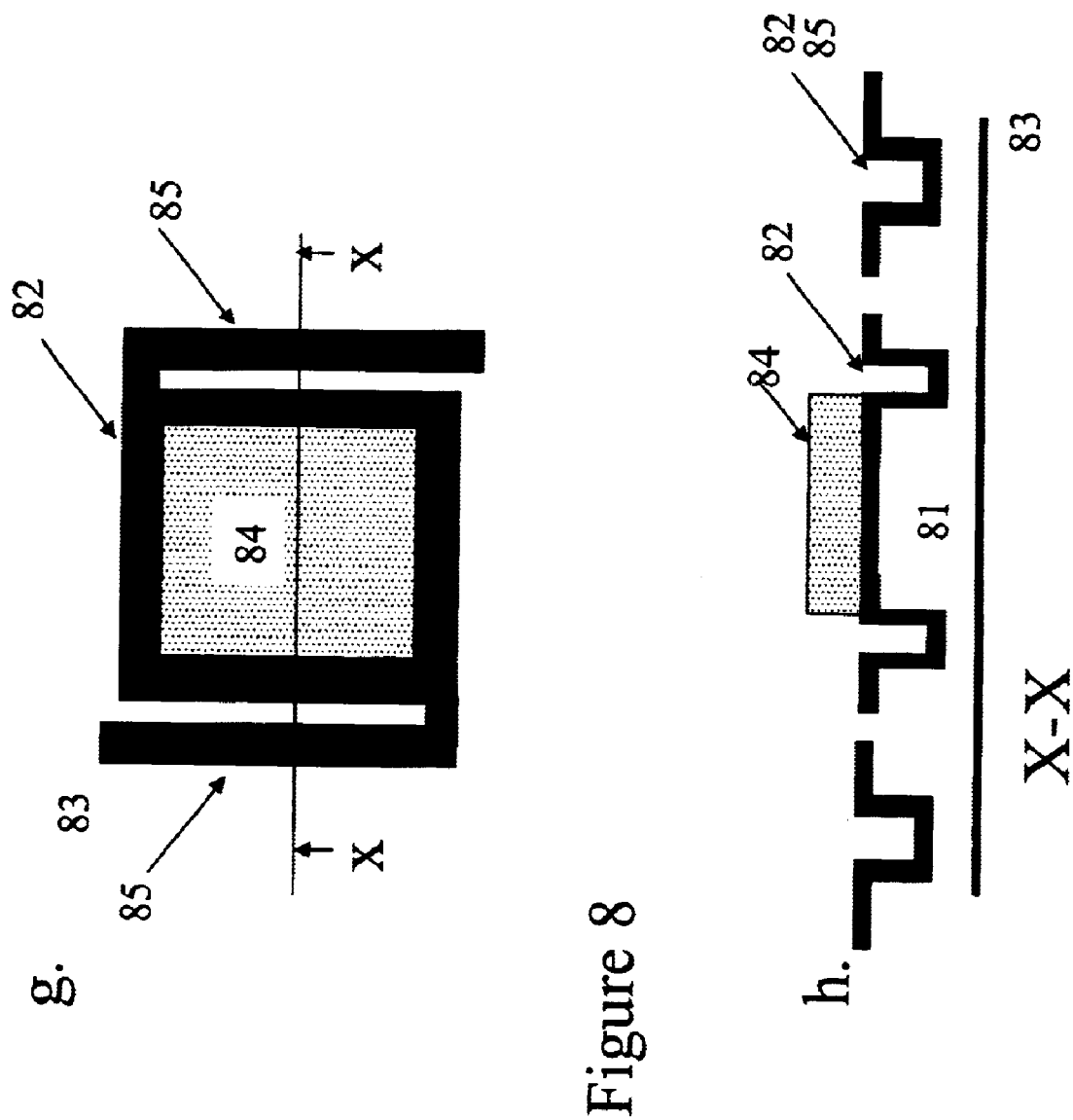

The subsequent processing comprises the steps of depositing and patterning the SiGe semiconductor layer (FIG. 9f) and optionally depositing and patterning an infrared absorber layer, of removing the sacrificial layer. These steps are similar to the ones described in European Patent no 0 867 702 and are illustrated in FIG. 7 in the case of U-shaped supporting beams.

In an alternative embodiment, the step of patterning of only a part of this sacrificial layer (step d) and the step of patterning of the sacrificial layer (step e) can be reversed.

The profiling of the supporting beams is done in the course of processing the bolometer. Although a limited number of additional process steps are required, these process steps can be integrated in the standard process sequence of the MEMS device. The depth d of the U-profile is determined by the partial patterning of the sacrificial layer in step b, and can be easily adapted by changing for example the etch time or the thickness of the sacrificial layer. In FIG. 6, the moment of inertia Iu of the U-profile is compared to the moment of inertia $I_R$ of a rectangular profile having beam height H, here equal to the layer thickness t and width B. There is an improvement in stiffness $R_1$ given by the following expression:

$$\frac{I_U}{I_R} = \frac{B_u H_u^3 - b_u h_u^3}{Bt^3} \tag{6}$$

Comparing the cross section $S_U$ of the U-profile to the cross section $S_R$ of a rectangular profile having thickness H and with B, there is a reduction in area $R_1$:

$$\frac{S_U}{S_R} = \frac{B_u H_u - b_u h_u}{Bt} \tag{7}$$

Since an aim of the present invention is to combine a maximal thermal insulation (or a minimum thermal capacity), hence a minimal section, with a maximal stiffness, the ratio of the moment of inertia I to the cross section S should be maximized. When comparing classical rectangular profiles with U-profiles, a figure of merit M can be defined. In case of the rectangular and U-profile defined in FIG. 6, this figure of merit M can be expressed as:

$$M = \frac{\left(\frac{I}{S}\right)_U}{\left(\frac{I}{S}\right)_R} = \frac{(B_u H_u^3 - b_u h_u^3)}{(B_u H_u - b_u h_u)} \frac{1}{t^2} \tag{8}$$

Figure 10:
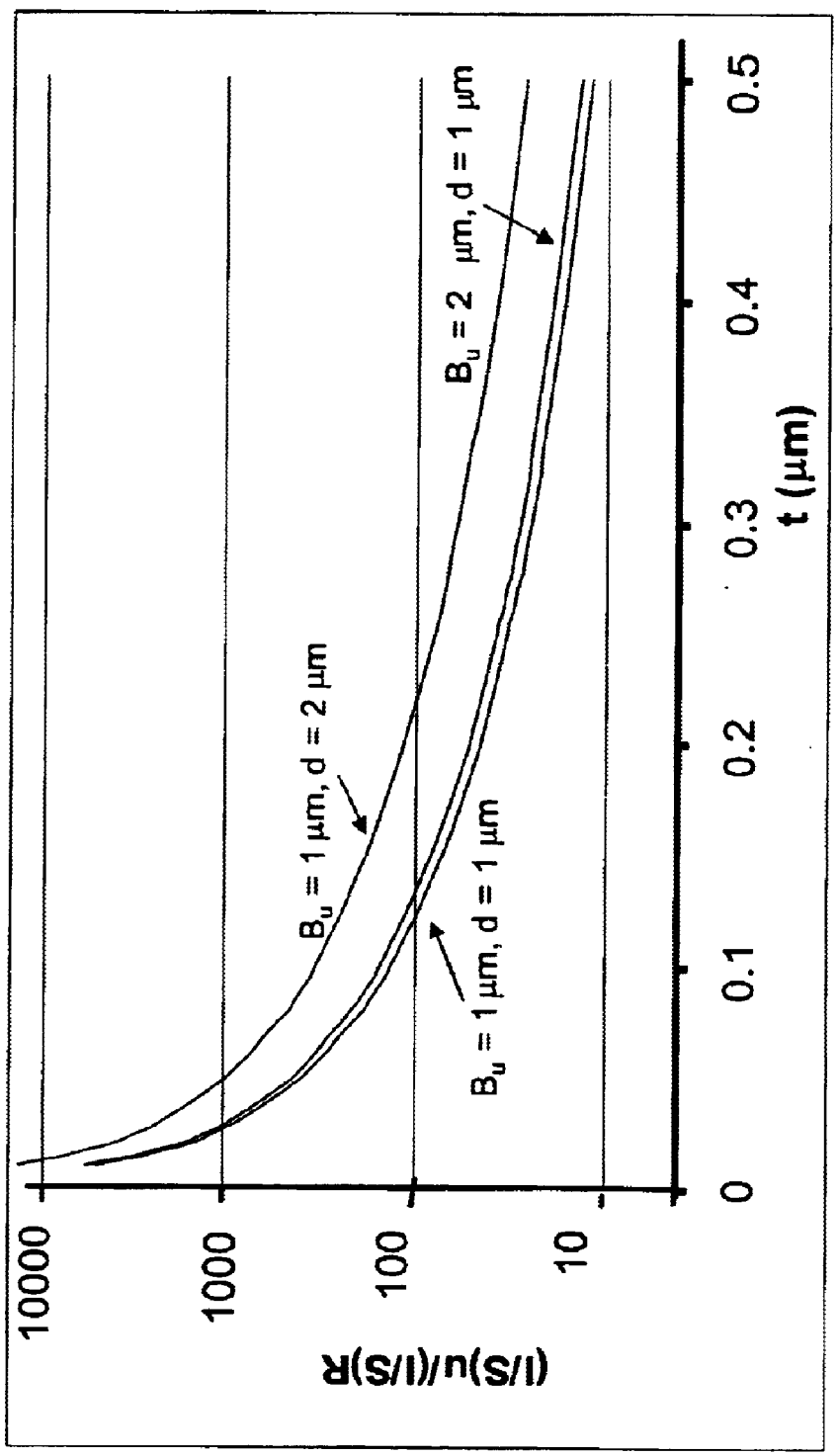
FIG. 10 is a graph showing merit M, comparing the ratio of the moment of inertia I and the beam cross section S for rectangular and U-shaped supporting beams. The figure of merit M is plotted as function of beam width $B_u$, device layer thickness t and depth d of the cavity. The value of width $B_u$ and depth d is kept constant, while the thickness t of the layer is varied, and hence the value of dimensions $H_u$, $h_u$ and $b_u$. All the dimensions of both profiles can be adapted by changes in processing parameters. Dimensions are given in micrometer (micron, μm).

This figure of merit M is plotted in FIG. 10, comparing a rectangular profile with a U-shaped profile. The value of width $B_u$ and depth d is kept constant, while the thickness t of the layer is varied, and hence the value of dimensions $H_u$, $h_u$, and $b_u$. All the dimensions of both profiles can be adapted by changes in processing parameters.

For all curves, the figure of merit increases with decreasing layer thickness t. Decreasing the layer thickness is very useful, as maximal thermal insulation (minimum thermal capacity) is obtained by minimal layer thickness. For rather thick device layers of 0.5 micron, the figure of merit is already in the order of 11, while for 10 times thinner layers, the figure of merit is above 1000. This value reflects a deflection 1000 times less at a given force for a beam having the same thermal insulation. There is only a small dependence of M on the width $B_u$, but on the other hand the influence of an increased U-profile depth d, resulting in a higher outer height $H_u$ of the U-profile, is clear. This is due to the fact that the moment of inertia is proportional to $H_u^3$, while the section is only proportional to $H_u$. Both I and S scale with $B_u$, resulting in a minor change in relative figure of merit as a function of $B_u$. The figure of merit M expresses the fact that a non-rectangular cross section of the supporting beam or of the sensing membrane element can improve the mechanical strength of such a beam or membrane element, while the mass and/or the cross sectional area of such beam or membrane element is decreased in comparison with a rectangular beam or membrane element. If a rectangular beam or membrane element having the same mechanical strength is created, this beam or membrane element will be heavier and/or have a larger cross sectional area.

Figure 4A:
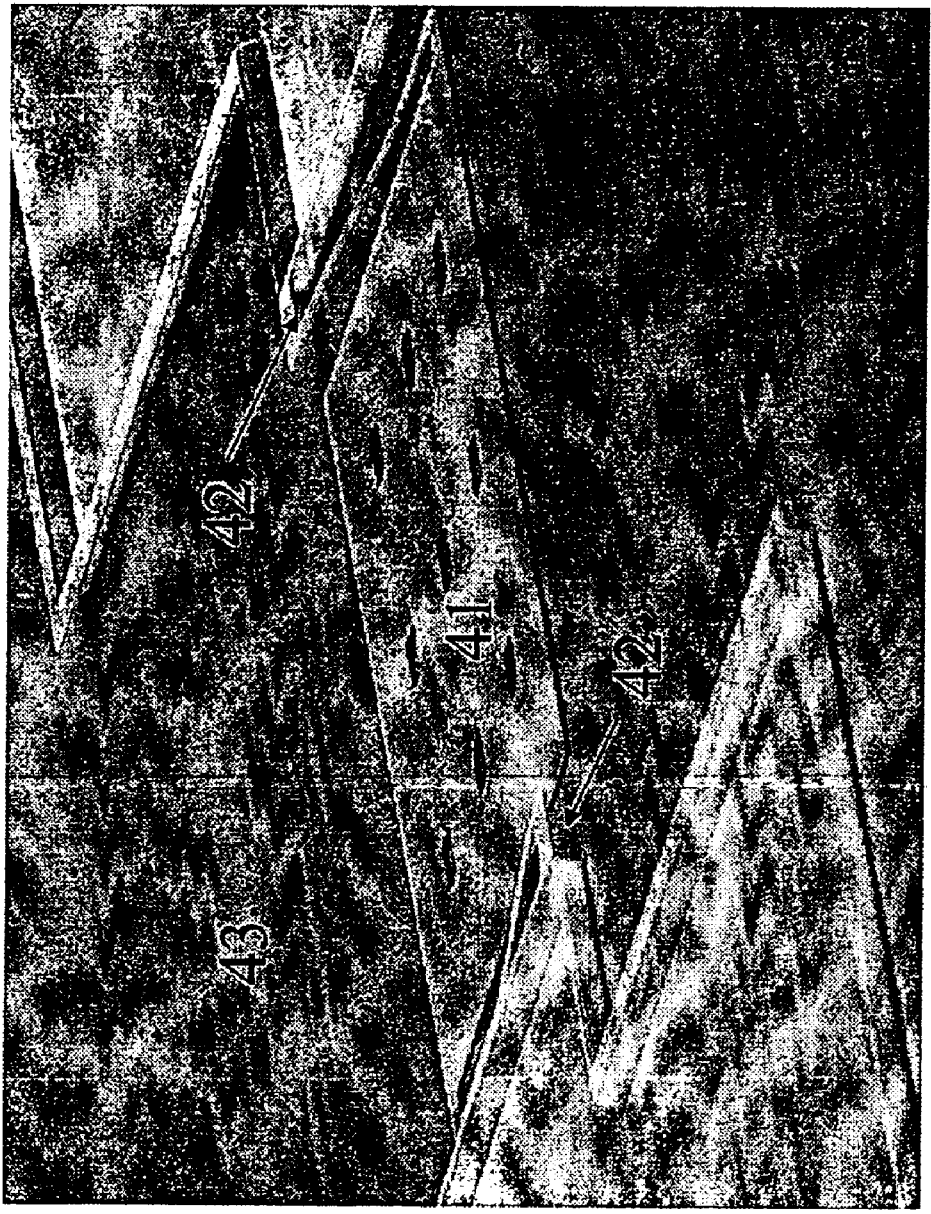
FIG. 4a is an example of a micrograph of an infrared bolometer illustrating the case where the supporting beams 42 bend towards the substrate 43 due to the sticking phenomenon of the membrane 41.
Figure 4B:
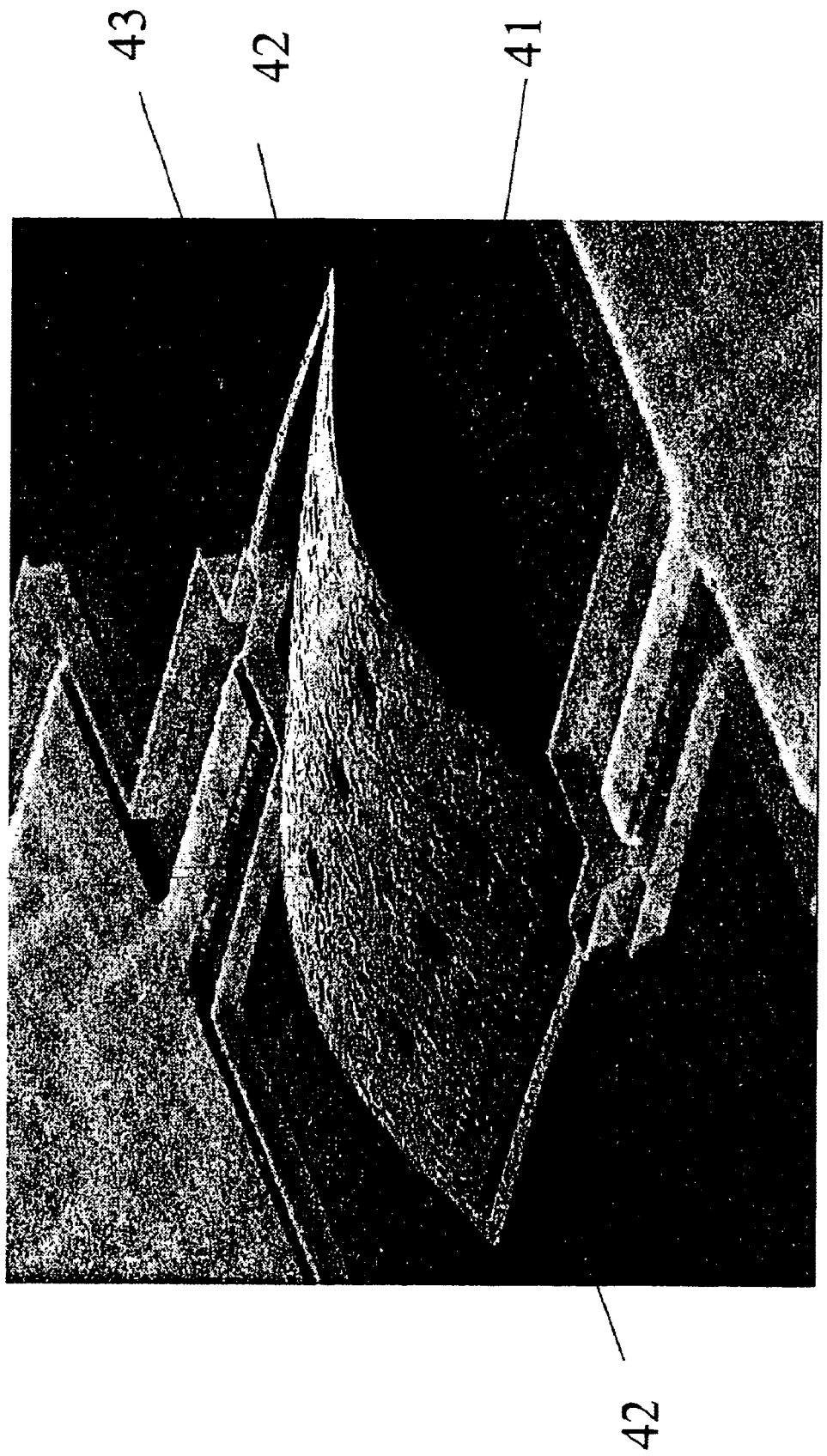
FIG. 4b is an example of an infrared bolometer illustrating the case where internal stresses bend a membrane 41 away from the substrate 43. The bolometer sensing element is composed of a stack of pSiGe, nitride, TaN layers.
Figure 5:
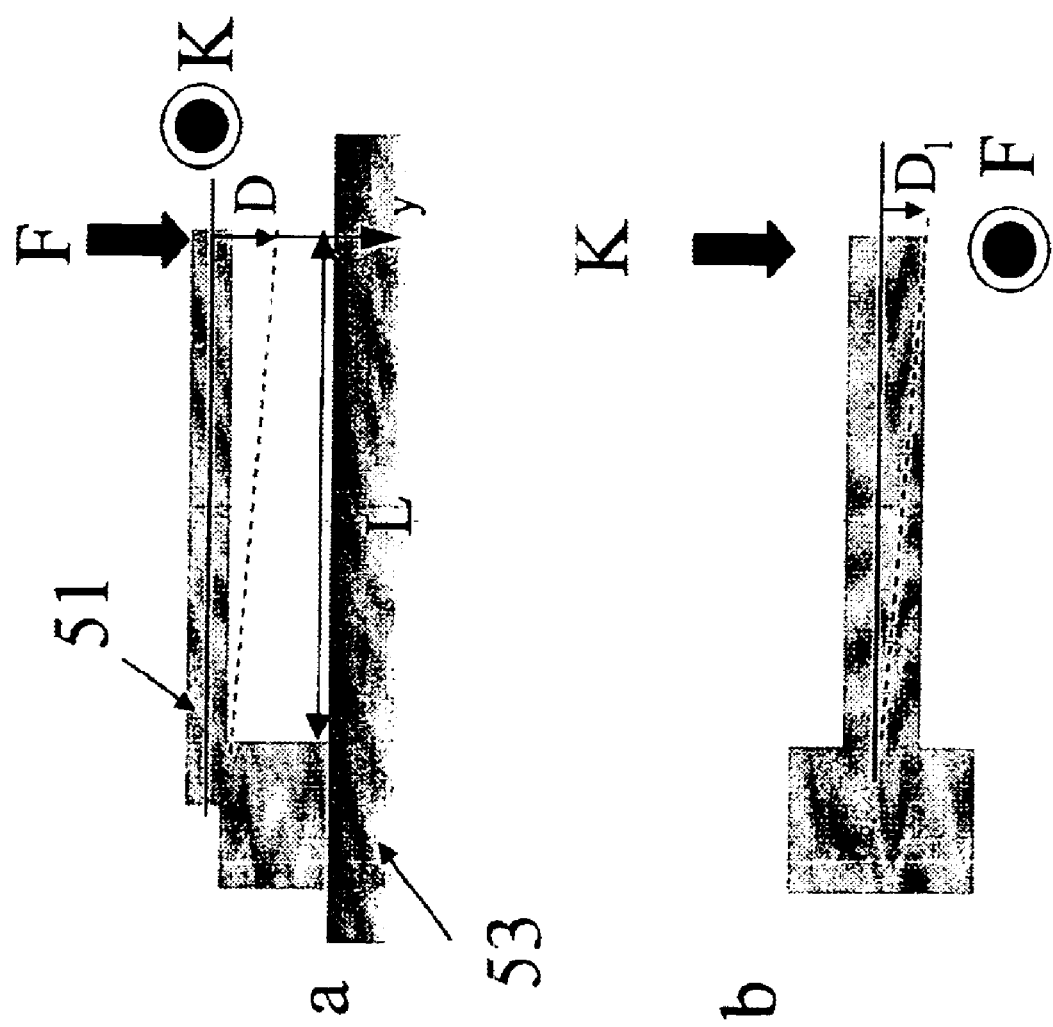
FIGS. 5a–b are schematic representations of a cantilever 51 having length L, being a freestanding element, only attached at one side to the substrate 53, with FIG. 5a being a side view, bending force F resulting in a bending D and lateral force K being applied perpendicular to the plane of the paper, and with FIG. 5b being a top view, lateral force K resulting in a bending $D_1$ and bending force F being applied perpendicular to the plane of the paper.
Figure 11:
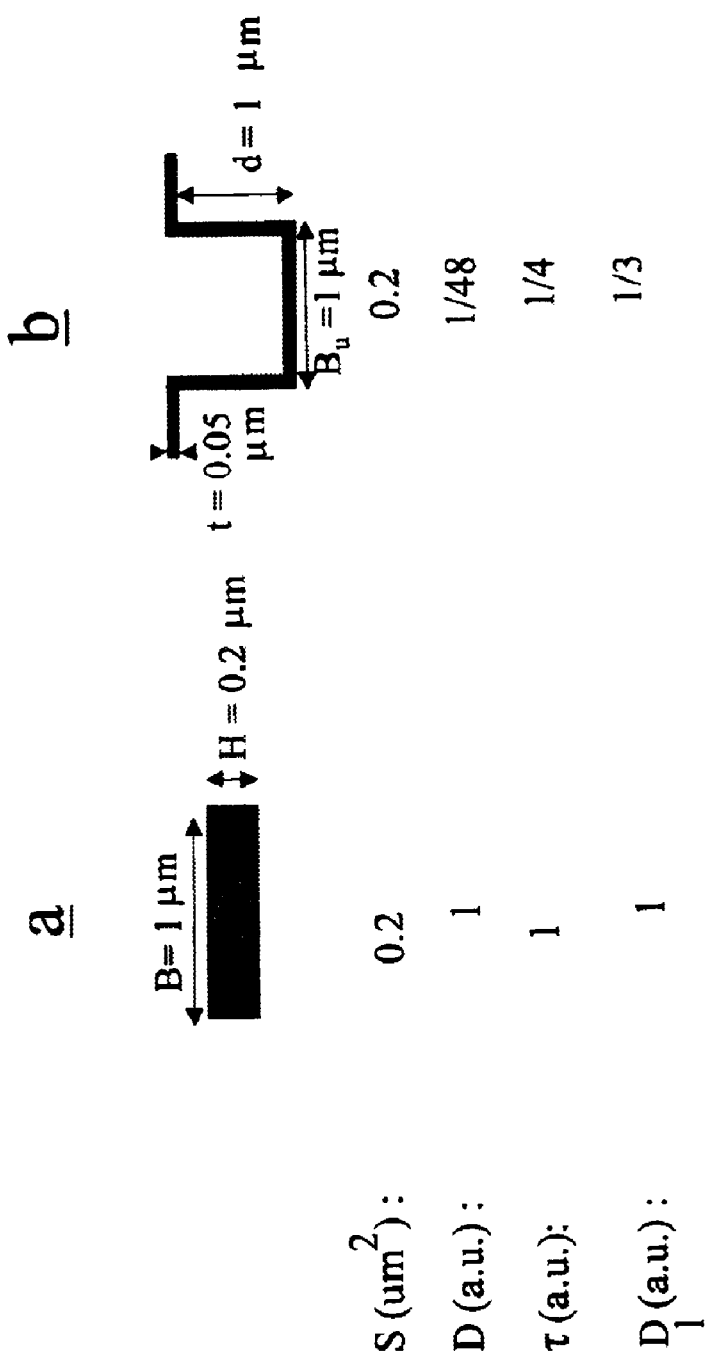
FIGS. 11a–b are examples of a bolometer comparison of cross section S, deflection D due to bending, deflection $D_1$ due to lateral force, time constant τ, with FIG. 11a being an example of a supporting beam having rectangular cross section and FIG. 11b being an example of a supporting beam having U-profile cross section.

The gain in mechanical stiffness of an U-profile section compared to a rectangular profile, keeping the same thermal insulation or thermal capacity, becomes even clearer if the example of a 50×50 $\mu m^2$ bolometer, supported by 2 beams with length L=45 μm is considered. Such a bolometer equipped with classical rectangular beams of width B=1 μm and device layer thickness t=0.2 μm, has a fairly low beam section of $S_R=0.2 \mu m^2$, resulting in a high thermal insulation. If we construct a 0.05 micrometer thin U-profile of width $B_u=1$ micrometer, and having a U-profile depth of d=1 micrometer, exactly the same section of 0.2 $\mu m^2$ is realized. However, due to the increased moment of inertia of the beams, the deflection D at a given force F is reduced almost by 2 orders of magnitude as shown in FIG. 11. Also the resistance to lateral forces K, i.e. to forces applied to the side of the beams as shown in FIG. 5, is improved by using U-profiles instead of rectangular beams. As shown in FIG. 11, the lateral deflection $D_1$ decreases with a factor of 3. At the same time, if the sensing membrane element is made from the same material(s) with the same thickness as the beams, the thermal capacity is reduced while the warping or distortion shown in FIG. 4B can be significantly reduced.

U-profiles can be very useful in all thermally insulated MEMS or micromachined systems. The use of U-profile can therefore provide more mechanical robustness to MEMS systems even when using thin layers.

Figures 12, 12A, 12B, 12C:
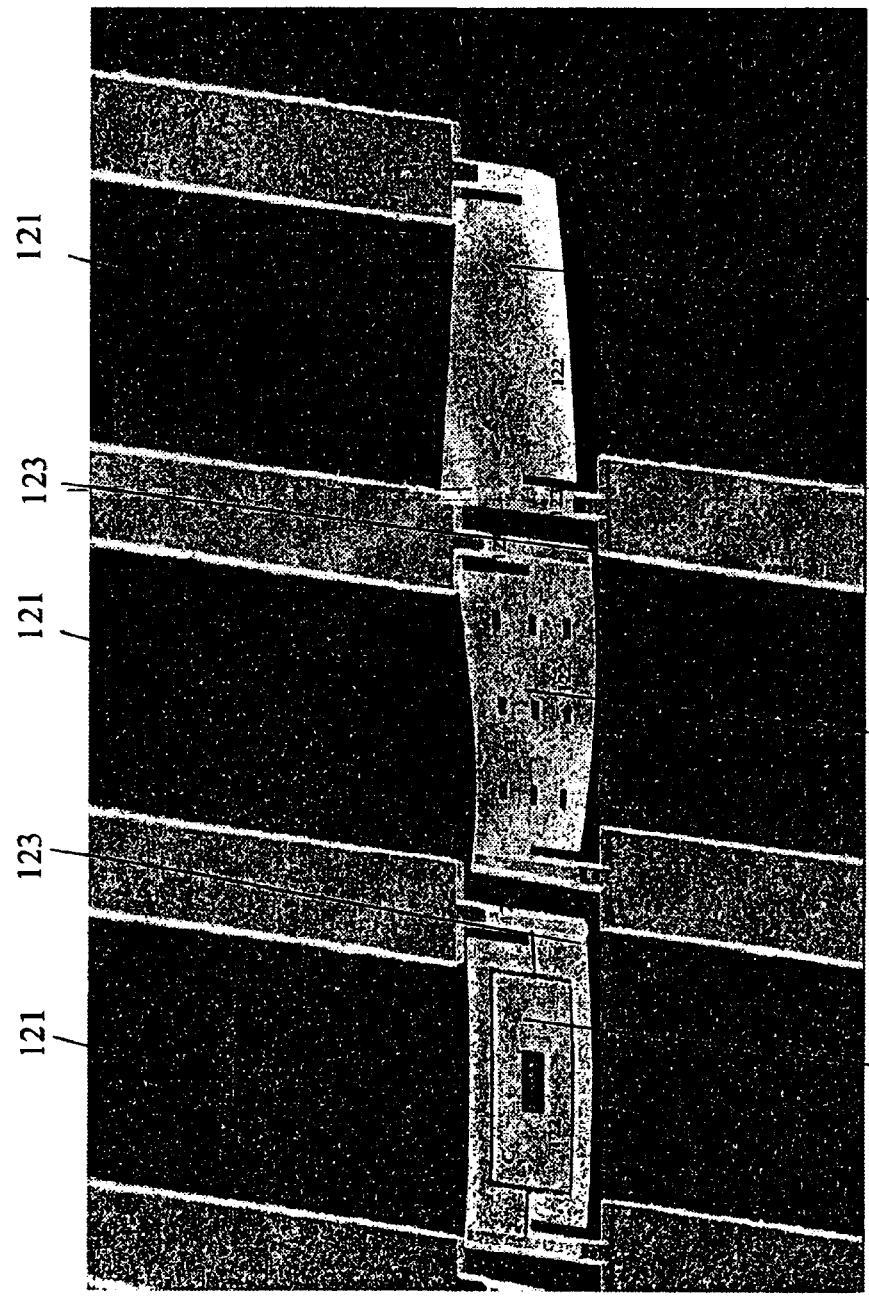
FIG. 12 is a topview picture using a scanning electron microscope (SEM) illustrating the influence of profiling the supporting beams 123 and/or the pixel or planar membrane element 122 on the deformation of the sensor due to the internal stress of the material. Thickness of the polySiGe layer was less then 100 nm. The area of the pixel is 50 by 50 square microns (substrate is element 121 in the Figures), with device A showing no profiling of the beams and the pixel, the planar element is bending upwards, device B showing beams having U-shaped cross section, planar membrane element has no profile, and device C showing beams having U-shaped cross section, planar membrane element has U-shaped topography.

However, the U-profile approach is not limited to beams or to thermal sensors. Any MEMS structure, membrane or planar membrane element can be made mechanically more stiff using a combination of perpendicular U-profiles. One can compare this with a sheet of corrugated iron or board: the U-profile is repeated along the length of the sheet. In FIG. 12 several embodiments of the invention are illustrated by means of SEM pictures. First, in FIG. 12, device a, no profiling in the beams 123 or the planar element 122a is done, using the standard MEMS processing. Both, beams and planar element 123, 122a, have a rectangular cross section. In FIG. 12, device b, during the processing the supporting beams 123 are shaped in a U-profile, thereby decreasing the deformation of the MEMS devices but the membrane 122b is still distorted. In FIG. 12, device c, also the planar element 122c is at least partly shaped with a U-profile, together with the supporting beams 123, thereby further decreasing the deformation of the MEMS devices. In FIG. 13a, the U-profile is repeated over the area of the sensing element in the form of a grid. If the U-profile is repeated (extended as elongated rigidizing microstructures) for example in 2 directions or dimensions, one obtains a structure like an egg box. Although finite-element simulations are required to quantify the gain in mechanical stiffness, classic mechanics theory and hardware simulation shows evidence for a large stiffness enhancement. Applying such a rigidized corrugated structure enables the use of thin, yet mechanically robust structures. In FIG. 13b, this embodiment is illustrated having the planar element is shaped in a three-dimensional way with rigidizing elongated microstructures extending in two dimensions. In FIG. 14, the improved mechanical strength towards external forces, e.g. gravity, adhesion forces, surface tension, is illustrated as a large piece of silicon is put on top of the profiled planar membrane element 142, whereby no deformation of the MEMS devices is noticed. In this case the membrane element 142 is rigidized with a square of U-shaped profiles as described with reference to the manufacturing steps of FIG. 8.

Figure 16:
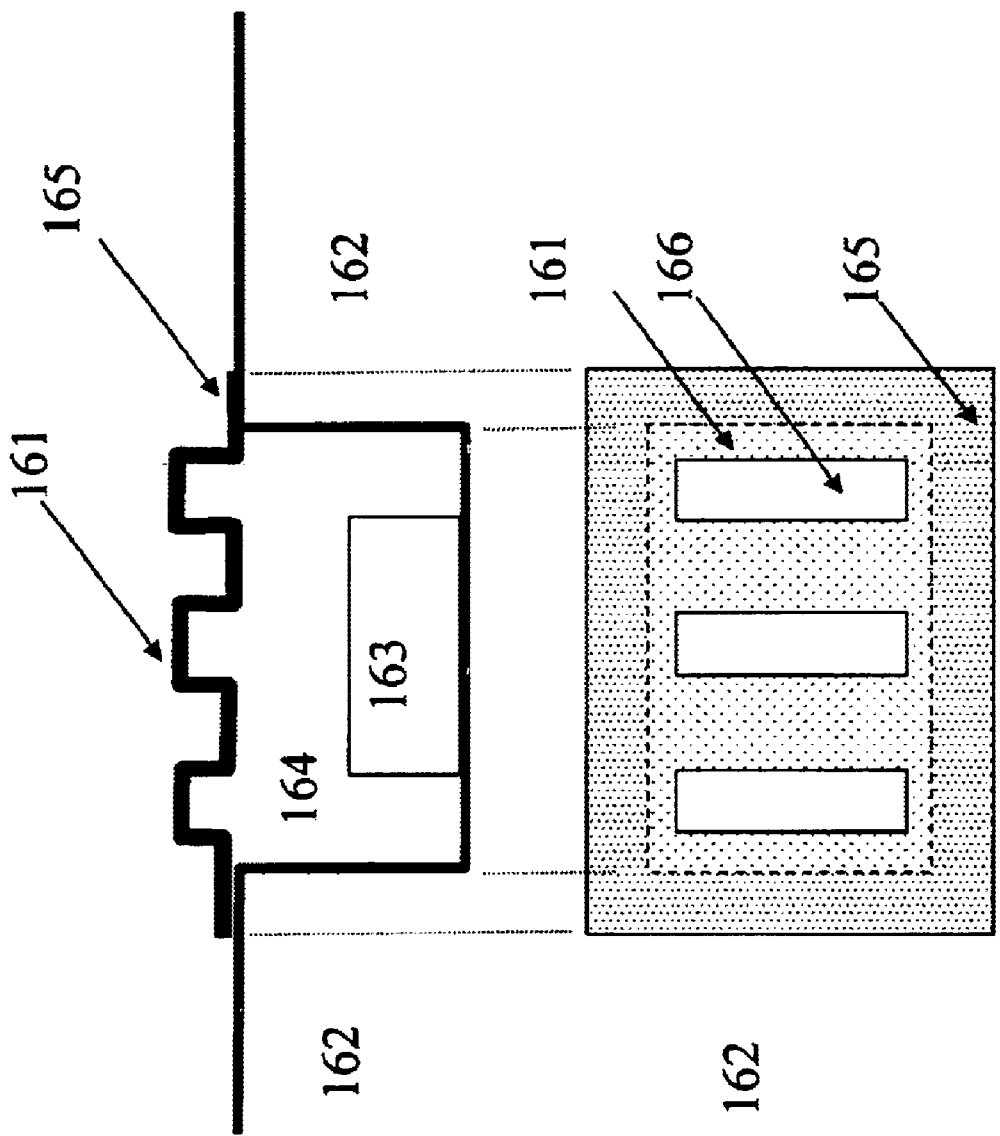
FIG. 16 are schematic illustrations of 0-level packaging using a membrane 161 to seal a MEMS devices enclosed in a cavity 164. The device 163 is present in a cavity 164 formed in a substrate 162.

In case of 0-level packaging of MEMS devices, i.e. the sealing of MEMS devices manufactured in or on a substrate, membranes can be used to close the cavity containing the MEMS devices, e.g. an RF switch or relay. This mechanical strength of such membrane can also be improved by improving the moment of inertia of this membrane. If the cavity is filled with an ambient at a given pressure the membrane must not only withstand internal stress, internal stress gradients, gravity but also the pressure of this ambient. FIGS. 16a–b illustrate an example of the 0-level packaging. FIG. 16a shows a cross-sectional view of a cavity 164 containing a MEMS device 163. The cavity 164 is sealed by membrane 161 which is anchored to substrate 162 by elements 165. FIG. 16b is a top view of the device. A device 163 is present in a cavity formed on the substrate (as shown in the cross-section in FIG. 16a) or in a substrate (as shown in FIG. 16b). The cavity is sealed by the membrane 161. The present invention may be advantageously used in MEMS devices in which a membrane is used.

The improvement of the mechanical strength of the supporting beams, but also of the MEMS-structure or planar membrane element itself, can solve the problem of residual strain gradients in the material which can be considered as internal forces. This internal stress can be present within a single layer or stack of layers of a single material due to a stress gradient within this material. This internal stress can be can be present in a stack of layers of different materials due to a difference in expansion coefficients or due to stress gradients in or in between these layers. In MEMS processing one has to take this internal stress into account, as this stress might be of greater concern than the stress resulting from external forces. For example if two materials, having different thermal expansion coefficients, are attached to each other to form a bi-layer, this bi-layer will deform, e.g. bent up-or downwards, when thermal processing is applied. This deformation can be limited when the layout of cross section of the bi-layer is changed, as explained above. As profiling, i.e. creating topography, of the supporting beams and/or the sensor or planar element improves the mechanical strength of the devices, e.g. towards internal and external forces, an additional degree of freedom in the process development of such devices is introduced. The development of such devices has to be optimized towards their electromechanical properties. These properties can be dependent on the internal stress of the layers deposited or resulting from the subsequent processing steps. If this stress can be relieved by profiling the beam(s) and/or the planar element(s), the process engineer can do a further optimization of the characteristics of the MEMS devices. The effect of stress is shown in FIG. 4b. For bolometer applications the stress in the layer and the stress gradient across a layer can be of utmost importance. In the FIG. 4b, the bending of the sensor part of the bolometer is shown. On top of a polySiGe monolayer 41 used to form the self-supporting membrane (attached to a substrate 43 by beams 42 holding the membrane 41 above the substrate 43), additional layers will be deposited. Firstly, an additional nitride layer is used to electrically insulate the polySiGe from a second additional layer, being a metallic absorber layer. For instance, on top of a 0.33 micron thick poly SiGe, having an internal tensile stress of about 60 MPa, being formed at 500–600 C, 60 nm LPCVD SiN formed at 600–700 C, and about 20 nm TaN formed at room temperature, is deposited. Due to the internal stress of the top lawyers (nitride and/or TaN) the sensor membrane element 41 will bend when cooling the device from the nitride deposition temperature down to room temperature. As one can see no three-dimensional microstructures are present to rigidize the membrane in this example. One aspect of the present invention is to use rigidizing microstructures in membranes to reduce the warping and distortion caused by locked-in stresses generated by device processing.

In WO 99/58985 a method for producing micromechanical components is disclosed. This method comprises the steps of depositing a sacrificial layer and a first layer, preferably polysilicon. Through openings defined in the first layer a sacrificial layer underneath the first layer is locally removed to create a cavity. The openings in the first layer are subsequently closed by depositing a planarising layer thereby sealing the cavity. The cavity can comprise a MEMS device, e.g. an accelerometer.

In case of large cavities this first layer or the planarizing layer has to be mechanically strong in order to be self-supporting or to withstand the pressure difference between the cavity and the outside world. This first layer or the planarizing layer can be deposited very thickly to yield the desired mechanical strength, but such depositing step can be very time consuming. High speed deposition processes of Si or SiGe exist but such processes operate at elevated temperatures. In some applications these MEMS devices have to be processed on top of a low-temperature substrate, e.g. a substrate comprising CMOS electronic circuit. This low-temperature substrate will limit the maximum temperature at which such post-processed devices can be formed. A common RPCVD SiGe process at lower temperatures, e.g. in the range 600–500 C, would have a deposition rate of about 20 nm/minutes. If layers of several microns need to be grown, this deposition step would require hours of processing time, what would be unacceptable.

The desired mechanical strength can, according to the present invention, be obtained by introducing three-dimensional microstructures in the membrane layer during deposition of this layer. These microstructures rigidize the membrane and make the membrane self-supporting even for thin membranes. If only thin layers, e.g. in the 0.1 micrometer range or below, are needed the common low-temperature processes still can be used with acceptable production time.

The disadvantage of introducing these rigidized membranes is that the underlying sacrificial layer has to be shaped to form a mold in which a layer can be deposited yielding a rigidized membrane. The sacrifical layer needs to be thicker compared to the WO 99/58985 case as it must comprise the mold. The total thickness of the sacrificial layer will be at least the thickness H of the original flat first layer as illustrated in FIG. 6. The U-profile having thickness $H_u$ formed by shaping a layer with thickness d is more rigid than the flat profile having the same thickness $H=H_u$. So thicker sacrificial layers need to be deposited, but in the lower temperature range, e.g. below 600 C, the deposition rate of PECVD oxide deposition process is higher than of the Si or SiGe deposition process. Instead of depositing oxide a resin such as BCB or polyimide can be spin-coated. Such a spin-coated process is executed at a low temperature and can form in a single step layers of several micrometers thick. In FIGS. 16a–b, a cavity 164 formed in a substrate 162, e.g. a silicon substrate, is sealed by a membrane 161. The membrane 161 includes upper portions 166. The membrane is connected to or anchored to the supporting substrate 162 by the support structures or anchor points 165. The membrane 161 is internally rigidized by microstructures 166 as can be seen both in the cross sectional view (FIG. 16a) and top view (FIG. 16b). The rigidizing in this example is only present above the cavity 166.

Figure 17:
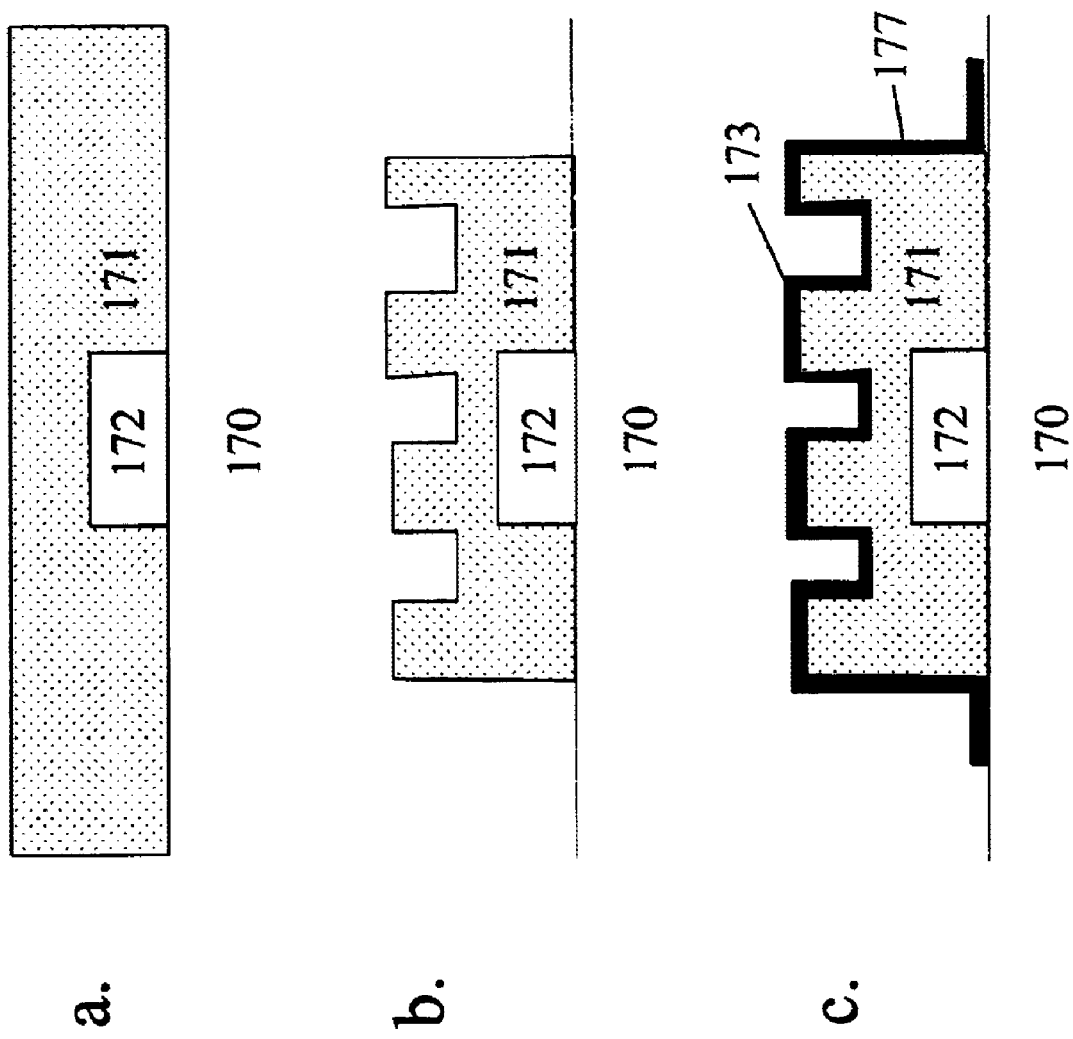
FIGS. 17a–f are schematic illustrations of 0-level packaging using a membrane 173 to seal a MEMS device 172 formed on top of a substrate 170.
Figure 17:
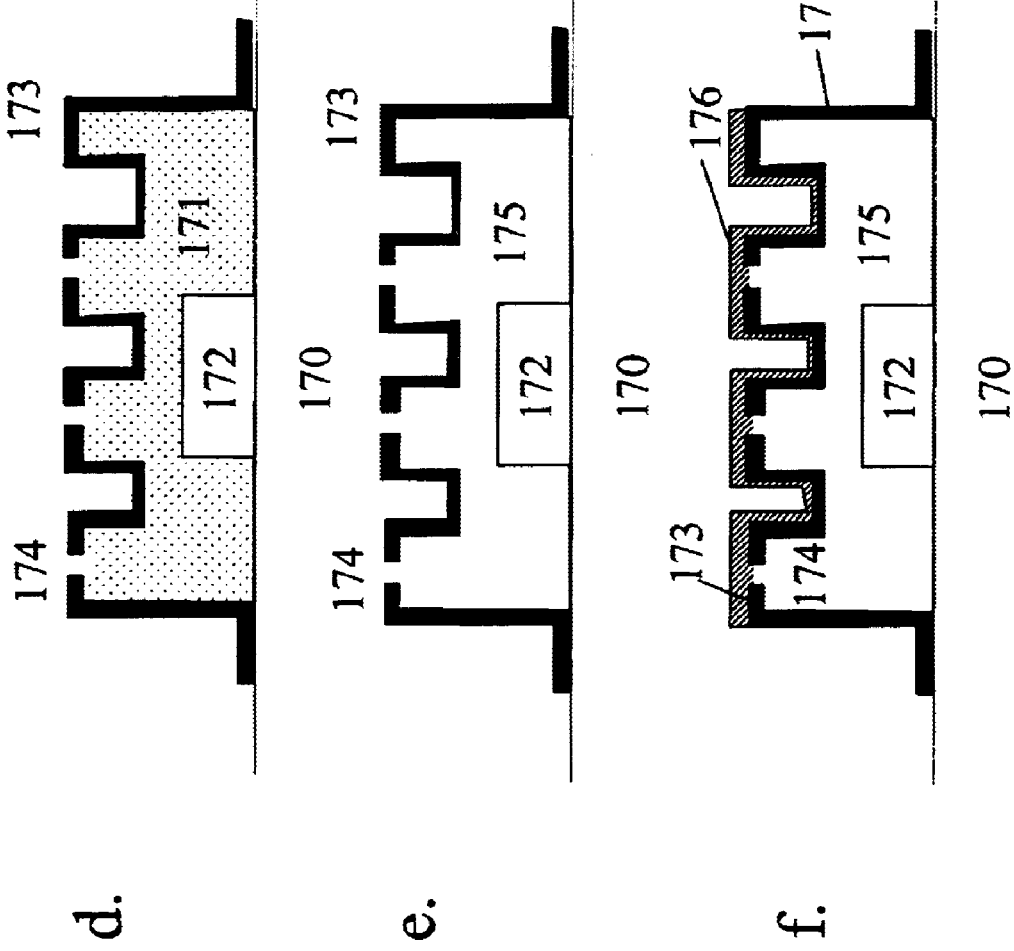

In FIG. 17, a schematic outline of such process is given. First, as shown in FIG. 17a, the sacrifical layer 171 is formed by depositing or spin-coating, covering the MEMS device 172. Then the sacrificial layer is patterned, as shown in FIG. 17b, having the MEMS device encapsulated. During this patterning, a mold is created in this sacrificial layer. A first or structure layer is deposited 173 onto this pre-shaped sacrificial layer 171, as shown in FIG. 17c. This structure layer is used to form the membrane 178 and the support structure 177 connecting the membrane 178 to the substrate 170. In this first layer 173, openings 174 are defined to allow the removal of the sacrificial layer 171, as shown in FIG. 17d. After the removal of the sacrificial layer, a self-supporting rigidized membrane 178 anchored to the substrate 170 remains, as shown in FIG. 17e. This removal can be done in a variety of ways including by wet etching, gaseous etching or plasma etching. To seal the cavity 175 containing the MEMS device 172, a planarising layer 176 is formed on top of the membrane closing the openings 177, as shown in FIG. 17f. The planarising layer can be formed in a variety of ways, including by spin-coating, depositing e.g. PVD.

MEMS devices, in which non-rectangular profiles such as U-profiles are applied, have the following advantages over MEMS devices with classical thick rectangular structures:

1) a shorter fabrication time, and hence lower fabrication cost, as for example deposition times can be considerably decreased when using thinner layers.
2) Due to the enhanced stiffness, such structures are less sensitive to mechanical stress resulting from internal (internal stresses) or external forces.
3) Due to the enhanced stiffness, such structures can better withstand chemical or mechanical forces applied during fabrication and operation of the device.
4) Yet another advantage of this approach is clear. The time response, i.e. the time constant τ of a thermal sensor such as a bolometer, is given by the ratio of the thermal capacity C and the thermal conductance G:

$$\tau = \frac{C}{G} \tag{9}$$

Since the cross section S in the previous example is constant to 0.2 square microns ($\mu m^2$), the time constant τ scales directly with the thermal capacity C. The thermal capacitance C is direct proportional to the type and amount of material present. The amount of material present is proportional to the device layer thickness t. Since the layer thickness t in above example is reduced from 0.2 micron to 0.05 micron, i.e. by a factor 4. For a polySiGe bolometer with a planar element of 50 $\mu$m×50 $\mu$m having a beam length of 45 $\mu$m, the thermal time constant changes from 33 milliseconds to 8 milliseconds. This reduction in thermal time constant enables the use of bolometers arrays for fast imaging camera applications, where time constants equal or below 10 milliseconds are required. In the classical bolometer fabrication process, this time requirement puts a limit on the maximal sensitivity that can be attained. So, the use of U-profiles in bolometer fabrication not only enhances the mechanical stiffness of the devices, but also considerable reduces the thermal time constant, even without changing the thermal insulation. If the planar element of the thermal sensor has a non-rectangular cross-section, e.g. an egg-board like profile, then the thickness of the layers used in the planar element can also be decreased. Thanks to the improved mechanical strength, the planar element can withstand the external and internal forces exercised on the planar element. If the dimensions of the planar element are decreased, the overall mass of the planar element and hence its thermal capacitance is decreased resulting in a faster response of the thermal sensor.

5) In standard MEMS technology using rectangular supporting beams, the cross section of the beams can be minimized by decreasing their width B. The minimal width B is limited by the state-of-the art lithography and etching techniques. In the state-of-the-art technology this minimal width B is slightly below 1 micron. In case of a U-shaped profile the minimal linewidth feature is the opening $B_u$ of the U-profile, as defined in FIG. 6. As explained above the thermal conductivity of the beams is determined by the overall cross section. Therefore a U-profile using a thin device layer thickness t allows larger beam width W and width of the opening of the sacrificial layer $B_u$. As a consequence no advanced and expensive lithographic patterning including high cost reticule sets, are required as these linewidths can be larger than 1 micrometer. In FIG. 15 the U-shaped beam has as dimension W=3.2 μm and $B_u$=1.6 μm. U-shaped beams having dimensions W=1.2 μm and $B_u$=0.6 μm have been realized.

What is claimed is:

1. A Micro Electro-Mechanical device. comprising:

a semiconductor substrate:

a membrane element composed of at least one continuous layer, at least a portion of the at least one continuous layer being internally rigidized; and a support system, wherein the support system comprises at least one elongated beam with two ends, one end attached to the membrane element and the other end attached to the substrate and said membrane element is mechanically connected to said substrate by said support system;

wherein the membrane element has a figure of merit M larger than 1; and wherein said figure of merit M is defined as the ratio of a first parameter to a second parameter, said first parameter being the ratio of moment of inertia along one axis to its corresponding thickness of said element, and said second parameter being the ratio of moment of inertia along the same axis to its corresponding thickness of a membrane element with a rectangular cross section.

2. The device as claimed in claim 1, wherein said at least one elongated beam comprises a rigidizing microstructure.

3. The device as claimed in claim 2, wherein the at least one elongated beam has a figure of merit M at least larger than I, wherein said figure of merit M is defined as the ratio of a first parameter to a second parameter, said first parameter being the ratio of moment of inertia along one axis to its corresponding thickness of said beam, and said second parameter being the ratio of moment of inertia along the same axis to its corresponding thickness of a beam with a rectangular cross section.

4. The device as claimed in claim 3, wherein said elongated beam has an I-shaped or U-shaped cross section perpendicular to the longitudinal direction of said elongated beam.

5. A Micro Electro-Mechanical device, comprising:

a semiconductor substrate;

a planar membrane element, the planar membrane element including rigidizing microstructures; and a support system, wherein said planar membrane element is mechanically connected to said substrate by said support system, wherein the planar membrane element has a figure of merit M larger than 1 with said figure of merit M being defined as the ratio of a first parameter to a second parameter, said first parameter being the ratio of moment of inertia along one axis to its corresponding thickness of said element, and said second parameter being the ratio of moment of inertia along the same axis to its corresponding thickness of a membrane element with a rectangular cross section.

wherein the support system comprises at least one elongated beam with two ends, one end attached to the planar membrane element and the other end attached to the substrate.

wherein said at least one elongated beam comprises a rigidizing microstructure.

wherein the at least one elongated beam has a figure of merit M at least larger than 1 with said figure of merit M being defined as the ratio of a first parameter to a second parameter, said first parameter being the ratio of moment of inertia along one axis to its corresponding thickness of said beam, and said second parameter being the ratio of moment of inertia along the same axis to its corresponding thickness of a beam with a rectangular cross section.

wherein said elongated beam has an I-shaped or U-shaped cross section perpendicular to the longitudinal direction of said elongated beam; and wherein at least a part of said planar membrane element has a U-shaped or I-shaped cross section.

6. The device as claimed in claim 5, wherein said planar membrane element is adapted for sensing electromagnetic radiation.

7. The device as claimed in claim 6, wherein said planar membrane element is adapted for sensing infrared radiation.

8. The device as claimed in claim 7, wherein said support system and said planar membrane element have a common layer, and said planar membrane element and said support system are patterned in the common layer.

9. The device as claimed in claim 8, wherein the rigidizing microstructures in the planar membrane element extend in two directions.

10. The device as claimed in claim 9, wherein the planar membrane element comprises one or more layers, which impart an internal stress on the planar membrane element sufficient to cause distortion thereof without support from the rigidizing microstructures.

11. An array of devices, each device of the array comprising:

a semiconductor substrate;

a membrane element composed of at least one continuous layer, at least a portion of the at least one continuous layer being internally rigidized; and a support system, wherein the support system comprises at least one elongated beam with two ends, one end attached to the membrane element and the other end attached to the substrate;

wherein said membrane element is mechanically connected to said substrate by said support system and has a figure of merit M larger than 1; and wherein said figure of merit M is defined as the ratio of a first parameter to a second parameter, said first parameter being the ratio of moment of inertia along one axis to its corresponding thickness of said element, and said second parameter being the ratio of moment of inertia along the same axis to its corresponding thickness of a membrane element with a rectangular cross section.

12. The device as claimed in claim 1, wherein the membrane element, including the internally rigidized portion, are constructed of the same material or materials.

13. The device as claimed in claim 1, wherein the internally rigidized portion of the membrane elemet and a remainder of the membrane element are constructed simultaneously.

14. A Micro Electro-Mechanical device, comprising:

a semiconductor substrate;

a membrane element composed of at least one continuous layer, at least a portion of the at least one continuous layer being internally rigidized; and a support system, wherein said membrane element is mechanically connected to said substrate by said support system, and the support system is not underneath the membrane element.

15. The device as claimed in claim 1, wherein the internally rigidized portion of the membrane element has a non-rectangular cross section.

16. The device as claimed in claim 1, wherein the internally rigidized portion of the membrane element is corrugated.

17. A Micro Electro-Mechanical device, comprising:

a semiconductor substrate;

a membrane element composed of at least one continuous layer, at least a portion of the at least one continuous layer being internally rigidized; and a support system, wherein said membrane element is mechanically connected to said substrate by said support system, and said support system and said membrane element have a common layer, said membrane element and said support system being patterned in the common layer.

18. The device as claimed in claim 17, wherein the internally rigidized portion in the membrane element extends in two directions.

19. The device as claimed in claim 17, wherein the membrane element comprises one or more layers which impart an internal stress on the membrane element sufficient to cause distortion thereof without support from the internally rigidized portion.

20. The device as claimed in claim 2, wherein the at least one elongated beam has a cross-section which is non-rectangular.

21. The device as claimed in claim 2, wherein the at least one elongated beam has a figure of merit M at least larger than 1, wherein said figure of merit M is defined as $$M = \frac{\left[\frac{I}{t}\right]_{\text{the-internally-rigidized-portion}}}{\left[\frac{I}{t}\right]_{\text{non-rigidized-membrane-element}}}$$

wherein I is the moment of inertia of the internally rigidized portion or of a non-rigidized elongated beam, and wherein t is the thickness of the layer of the internally rigidized portion or of the non-rigidized elongated beam.

22. The device as claimed in claim 11, wherein the array of devices comprise a camera.

23. A Micro Electro-Mechanical device, comprising:

a semiconductor substrate, a membrane element, at least a part of said membrane element having a non-rectangular cross section; and a support system, wherein said membrane element is mechanically connected to said substrate by said support system, and wherein the at least a part of said membrane element has a U-shaped or I-shaped cross section.

\* \* \* \* \*